(12) United States Patent
Han

(10) Patent No.: US 11,010,226 B2
(45) Date of Patent: May 18, 2021

(54) MEMORY CONTROLLER AND METHOD OF OPERATING THE SAME

(71) Applicant: SK hynix Inc., Gyeonggi-do (KR)

(72) Inventor: Chang Hyun Han, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/694,472

(22) Filed: Nov. 25, 2019

(65) Prior Publication Data

US 2020/0356430 A1 Nov. 12, 2020

(30) Foreign Application Priority Data

May 10, 2019 (KR) .................. 10-2019-0055133

(51) Int. Cl.
| | |
|---|---|
| *G06F 11/07* | (2006.01) |
| *G06F 11/10* | (2006.01) |
| *G06F 11/30* | (2006.01) |
| *G06F 13/16* | (2006.01) |
| *G11C 16/16* | (2006.01) |
| *G11C 16/12* | (2006.01) |
| *G11C 16/34* | (2006.01) |
| *G11C 29/42* | (2006.01) |

(52) U.S. Cl.
CPC ........ *G06F 11/076* (2013.01); *G06F 11/1044* (2013.01); *G06F 11/3058* (2013.01); *G06F 13/1668* (2013.01); *G11C 16/12* (2013.01); *G11C 16/16* (2013.01); *G11C 16/349* (2013.01); *G11C 29/42* (2013.01)

(58) Field of Classification Search
CPC .... H04L 1/0071; H04L 1/0057; H03M 13/13; H03M 13/2792; H03M 13/616
See application file for complete search history.

(56) References Cited

U.S. PATENT DOCUMENTS

| | | | | |
|---|---|---|---|---|
| 2009/0287975 A1* | 11/2009 | Kim | .................... | G11C 11/5628 |
| | | | | 714/746 |
| 2012/0236656 A1* | 9/2012 | Cometti | ................. | G11C 16/26 |
| | | | | 365/185.22 |
| 2012/0239976 A1* | 9/2012 | Cometti | ................. | G11C 16/10 |
| | | | | 714/24 |

(Continued)

FOREIGN PATENT DOCUMENTS

| | | |
|---|---|---|
| KR | 10-2015-0087646 | 7/2015 |
| KR | 10-2017-0027556 | 3/2017 |

*Primary Examiner* — Kyle Vallecillo
(74) *Attorney, Agent, or Firm* — IP & T Group LLP

(57) ABSTRACT

Provided herein is a memory controller and a method of operating the same. The memory controller may include a program erase counter configured to count a number of program and erase operations performed on the memory device and then generate a current program/erase count value, an error correction counter configured to count a number of error corrections for correcting error in an operation performed on the memory device and then generate a current error correction count value and a power consumption predictor configured to, predict a future program/erase count value based on the current program/erase count value, predict future power consumption of a storage device including the memory device and the memory controller, the future power consumption corresponding to the predicted program/erase count value and output information about the predicted power consumption to a host.

20 Claims, 15 Drawing Sheets

(56) References Cited

U.S. PATENT DOCUMENTS

| | | | |
|---|---|---|---|
| 2013/0007343 A1* | 1/2013 | Rub | G06F 12/0246 |
| | | | 711/103 |
| 2013/0145079 A1* | 6/2013 | Lee | G06F 12/0246 |
| | | | 711/103 |
| 2014/0136927 A1* | 5/2014 | Li | G06F 11/1068 |
| | | | 714/768 |
| 2015/0043282 A1* | 2/2015 | Shin | G11C 11/5642 |
| | | | 365/185.21 |
| 2020/0265903 A1* | 8/2020 | Kim | G11C 11/5671 |
| 2020/0285419 A1* | 9/2020 | Ng | G06F 3/0659 |

\* cited by examiner

FIG. 5

| PE_COUNT | AVECC_COUNT | Anticipated Power Consumption |
|---|---|---|
| 500 | 10 | 300 |
| 1000 | 50 | 300 |
| 1500 | 300 | 300 |
| 2000 | 400 | 350 |
| 2500 | 1000 | 370 |
| 3000 | 3000 | 400 |

FIG. 6

| TIME | AVECC_COUNT | Anticipated Power Consumption |
|---|---|---|
| t_ref1−2*ta | 10 | 300 |
| t_ref1−ta | 50 | 300 |
| t_ref1 | 300 | 300 |
| t_ref1+ta | 400 | 350 |
| t_ref1+2*ta | 1000 | 370 |
| t_ref1+3*ta | 3000 | 400 |

| TIME | ECC_COUNT | Anticipated Power Consumption |
|---|---|---|
| t_ref1 | 50 | 300 |
| t_ref1+ta | 300 | 300 |
| t_ref1+2*ta | 400 | 350 |
| t_ref1+3*ta | 1000 | 370 |

| PE_COUNT | ECC_COUNT | Anticipated Power Consumption |
|---|---|---|
| 1500 | 50 | 300 |
| 2000 | 300 | 300 |
| 2500 | 400 | 350 |
| 3000 | 1000 | 370 |

FIG. 9A

| TIME | ECC_COUNT | Anticipated Power Consumption |
|---|---|---|
| t_ref2 | 300 | 300 |
| t_ref2+tb | 400 | 350 |
| t_ref2+2*tb | 1000 | 370 |
| t_ref2+3*tb | 3000 | 400 |
| t_ref2+4*tb | 6000 | 450 |

FIG. 9B

| PE_COUNT | ECC_COUNT | Anticipated Power Consumption |
|---|---|---|
| 1000 | 300 | 300 |
| 1500 | 400 | 350 |
| 2000 | 1000 | 370 |
| 2500 | 3000 | 400 |
| 3000 | 6000 | 450 |

MEMORY CONTROLLER AND METHOD OF OPERATING THE SAME

CROSS-REFERENCE TO RELATED APPLICATION

The present application claims priority under 35 U.S.C. § 119(a) to Korean patent application number 10-2019-0055133 filed on May 10, 2019, which is incorporated herein by reference in its entirety.

BACKGROUND

1. Field of Invention

Various embodiments of the present disclosure generally relate to an electronic device, and more particularly, to a memory controller and a method of operating the memory controller.

2. Description of Related Art

A storage device stores data under the control of a host device such as a computer, a smartphone, or a smartpad. Examples of storage devices include hard disk drives (HDD) which store data in a magnetic disk, and semiconductor based devices such as a solid state drive (SSD) or a memory card which stores data in a semiconductor memory.

Semiconductor based storage devices may typically include a memory device in which data is stored and a memory controller which controls the storage of data in the memory device. A memory device may be classified into volatile and nonvolatile memory. Examples of nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a memory controller that predicts power consumption of a storage device and outputs information about the predicted power consumption to a host and to a method of operating the memory controller.

An embodiment of the present invention may provide for a memory controller for controlling a memory device that stores data. The memory controller may include a program erase counter configured to count a number of program and erase operations performed on the memory device and then generate a current program/erase count value, an error correction counter configured to count a number of error corrections for correcting error in an operation performed on the memory device and then generate a current error correction count value and a power consumption predictor configured to, predict a future program/erase count value based on the current program/erase count value, predict future power consumption of a storage device including the memory device and the memory controller, the future power consumption corresponding to the predicted program/erase count value and output information about the predicted power consumption to a host.

An embodiment of the present invention may provide for a memory controller for controlling a memory device that stores data. The memory controller may include a program erase counter configured to count a number of program and erase operations performed on the memory device and then generate a current program/erase count value, an error correction counter configured to count a number of error corrections for correcting errors in an operation performed on the memory device and then generate a current error correction count value and a power consumption predictor configured to, set a time point at which the current program/erase count value is received as a reference time point, predict future power consumption of a storage device including includes the memory device and the memory controller, the future power consumption corresponding to a prediction time point determined based on the reference time point and output information about the predicted power consumption to a host.

An embodiment of the present invention may provide for a method of operating a memory controller for controlling a memory device that stores data. The method may include counting a number of program and erase operations performed on the memory device, and then generating a current program/erase count value, counting a number of error corrections for correcting error in an operation performed on the memory device, and then generating a current error correction count value, predicting future power consumption of a storage device including the memory device and the memory controller based on the current program/erase count value and the current error correction count value and outputting information about the predicted power consumption to a host.

An embodiment of the present invention may provide for a method of operating a memory controller for controlling a memory device that stores data. The method may include storing, in the controller, a reference table having entries of program/erase (PE) counts each including fields of an error correction (ECC) count and power consumption (PC) with reference to a corresponding PE count and providing a host with a value of the PC selected as predicted PC among values of the PC greater than a value of the PC corresponding to a currently measured ECC count, wherein the PE count is a number of times PE operations are performed to memory cells of the memory device, wherein the ECC count is an average number of times of error correction operations performed to data stored in the memory device, and wherein the PC is an amount of power consumed by the controller and the memory device with regard to an error correction operation.

These and other advantages and features of the present invention will become apparent to those skilled in the art to which the invention pertains from the following detailed description in conjunction with the following references.

BRIEF DESCRIPTION OF THE DRAWINGS

FIG. 5 is a diagram illustrating an example of a reference table.

FIG. 6 is a diagram illustrating an example of a reference table.

FIGS. 9A and 9B are diagrams illustrating examples of an adjusted table generated based on a reference table.

DETAILED DESCRIPTION

Figure 1:
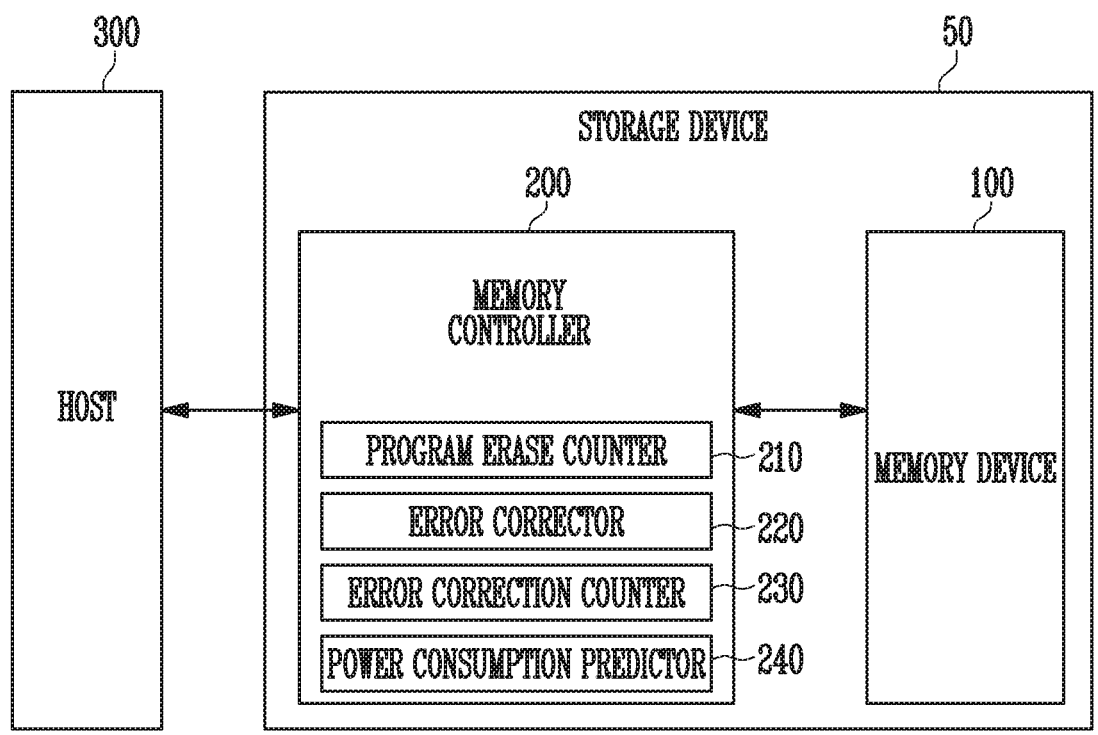
FIG. 1 is a block diagram illustrating a storage device according to an embodiment of the present invention.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, so that those of ordinary skill in the art can easily carry out the technical idea of the present disclosure.

FIG. 1 is a block diagram illustrating a storage device 50 according to an embodiment of the present invention.

Referring to FIG. 1, the storage device 50 may include a memory device 100 and a memory controller 200.

The storage device 50 may store data under the control of a host 300, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is used for communication with the host 300. For example, the storage device 50 may be implemented as any one of various types of storage devices, such as, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI- E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory controller 200 may control the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host 300 and the memory device 100.

The memory controller 200 may include a program erase counter 210. The program erase counter 210 may count the number of program and erase operations performed on the memory device. The program erase counter 210 may count the number of program and erase operations, and then generate and store a program/erase count value PE_COUNT. The program erase counter 210 may output the program/erase count value PE_COUNT to a power consumption predictor 240.

When a memory cell included in the memory device is programmed and then erased, the program erase counter 210 may generate the program/erase count value PE_COUNT. That is, when the erase operation is completed after the program operation has been performed on the memory device, the program erase counter 210 may count the number of program and erase operations.

In an embodiment, the program erase counter 210 may count the number of times that the program operation and the erase operation are performed on each of a plurality of memory cells included in the memory device 100. Alternatively, the program erase counter 210 may count the number of times that a program operation and an erase operation are performed on each of a plurality of memory blocks included in the memory device 100. The program/erase count value PE_COUNT that is counted for each of the plurality of memory blocks may be the average of program/erase count values PE_COUNT of memory cells included in each of the plurality of memory blocks. In an embodiment, the program erase counter 210 may determine the average of the numbers of program and erase operations performed on all memory cells included in the memory device to be the program/erase count value PE_COUNT.

The memory controller 200 may include an error corrector 220. The error corrector 220 may correct errors in each operation performed on the memory device 100. For example, when the memory device 100 performs an operation, a program operation or a read operation may fail due to the degradation or the like of memory cells. The error corrector 220 may perform an error correction operation for correcting failed operations.

In an embodiment, the error corrector 220 may output error correction information ECC_INF indicating that errors have been corrected. The error correction information ECC_INF indicates the number of times that errors are corrected (i.e., the number of error correction operations) until the operation performed on the memory device 100 is completed. The error corrector 220 may output the error correction information ECC_INF whenever the operation performed on the memory device 100 is completed. Therefore, the number of error corrections performed in order to complete one operation performed on the memory device 100 may be included in the error correction information ECC_INF.

In an embodiment, the error corrector 220 may output the error correction information ECC_INF to an error correction counter 230. The error correction counter 230 may receive the error correction information ECC_INF and then count the number of error corrections.

The memory controller 200 may include the error correction counter 230. The error correction counter 230 may count the number of error corrections for correcting errors in each operation performed on the memory device 100. The error correction counter 230 may generate and store an error correction count value ECC_COUNT in which the number of error corrections is counted. The error correction counter 230 may output the error correction count value ECC_COUNT to the power consumption predictor 240.

For example, the error correction counter 230 may receive the error correction information ECC_INF from the error corrector 220. The error correction counter 230 may count the number of error corrections based on the error correction information ECC_INF and then generate the error correction count value ECC_COUNT.

In an embodiment, the error correction counter 230 may count the number of error corrections performed until the operation performed on the memory device 100 is completed. That is, since the error corrector 220 outputs the error correction information ECC_INF whenever error in the operation performed on the memory device 100 is corrected or whenever the operation performed on the memory device 100 is completed, the error correction counter 230 may receive the error correction information ECC_INF and then generate the error correction count value ECC_COUNT. The error correction count value ECC_COUNT may be cumulatively generated.

The memory controller 200 may include the power consumption predictor 240. The power consumption predictor 240 may receive a power consumption prediction request PCP_REQ. The power consumption prediction request PCP_REQ may be a request for predicting the amount of power to be consumed by the storage device.

The power consumption predictor 240 may predict the amount of power to be consumed (power consumption) by the storage device either upon receiving the power consumption prediction request PCP_REQ from the host or in response to an internal request provided in the memory controller 200. The power consumption predictor 240 may output information about the predicted power consumption PRE_PC to the host 300 by predicting the amount of power to be consumed (i.e., power consumption) by the storage device. The power consumption predictor 240 may output information about the current power consumption of the storage device, together with the predicted power consumption PRE_PC, to the host 300. That is, the power consumption predictor 240 may predict the amount of power to be consumed (i.e., power consumption) by the storage device based on the current power consumption of the storage device, and may output information about the predicted power consumption to the host. The current power consumption of the storage device may be determined based on the error correction count value ECC_COUNT output from the error correction counter 230.

For example, the power consumption predictor 240 may receive a current program/erase count value PE_COUNT from the program erase counter 210. Also, the power consumption predictor 240 may receive a current error correction count value ECC_COUNT from the error correction counter 230. Based on the program/erase count value PE_COUNT and the error correction count value ECC_COUNT, the power consumption predictor 240 may predict future power consumption, which is an amount of power to be consumed by the storage device 50 including the memory device 100 and the memory controller 200.

In an embodiment, the power consumption predictor 240 may predict a future program/erase count value PE_COUNT based on the program/erase count value PE_COUNT, and may predict the future power consumption of the storage device 50 including the memory device 100 and the memory controller 200, which correspond to the predicted program/erase count value PE_COUNT. Alternatively, the power consumption predictor 240 may set a time point at which the current program/erase count value PE_COUNT is received as a reference time point, and may predict the future power consumption of the storage device including the memory device and the memory controller, which correspond to a prediction time point determined based on the reference time point.

The predicted power consumption PRE_PC may be the future power consumption of the storage device 50 after the storage device 50 receives the power consumption prediction request PCP_REQ from the host 300 or receives the power consumption prediction request PCP_REQ from the inside of the memory controller 200. The time elapsed since the power consumption prediction request PCP_REQ is received from the host 300 may be the prediction time point.

The power consumption predictor 240 may output the predicted power consumption PRE_PC of the storage device 50, corresponding to the prediction time point, to the host 300.

The power consumption predictor 240 may store information about a time at which the power of the storage device 50 is turned on so as to determine the prediction time point. The power consumption predictor 240 may set, as the reference time point, a time point at which the current program/erase count value PE_COUNT is received from the program erase counter 210 after the power of the storage device 50 is turned on so as to predict power consumption. The power consumption predictor 240 may set a point of time elapsed from the reference time point as the prediction time point.

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells. A single memory block may include a plurality of pages. In an embodiment, a page may be a unit by which data is stored in the memory device 100 or by which data stored in the memory device 100 is read. A memory block may be a unit by which data is erased.

In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a Low Power DDR (LPDDR) SDRAM, a Rambus dynamic random access memory (RDRAM), a NAND flash memory, a vertical NAND flash memory, a NOR flash memory device, a resistive RAM (RRAM), a phase-change random access memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

In an embodiment, the memory device 100 may be implemented as a three-dimensional (3D) array structure. The present disclosure may also be applied not only to a flash memory device 100 in which a charge storage layer is formed of a conductive floating gate (FG), but also to a charge trap flash (CTF) memory device in which a charge storage layer is formed of an insulating layer.

In an embodiment, each of the memory cells included in the memory device 100 may be implemented as a Single-Level Cell (SLC) in which one data bit is stored. Alternatively, each of the memory cells included in the memory device 100 may be implemented as a Multi-level Cell (MLC) in which two data bits are stored, a Triple-Level Cell (TLC) in which three data bits are stored, or a Quad-Level Cell (QLC) in which four data bits are stored.

The memory device 100 may receive a command and an address from the memory controller 200, and may access the area of the memory cell array, selected by the address. That is, the memory device 100 performs an operation corresponding to the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory device 100 may perform a program operation or an erase operation using a set operating voltage under the control of the memory controller 200.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored. Further, the memory controller 200 may store mapping information, which establishes mapping relationships between logical block addresses (LBA) and physical block addresses (PBA), in the buffer memory.

The memory controller 200 may control the memory device 100 so that a program operation, a read operation or an erase operation is performed in response to a request received from the host 300. During a program operation, the memory controller 200 may provide a program command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a program command, an address, and data without receiving a request from the host 300, and may transmit the generated program command, address, and data to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 using an interleaving scheme to improve operating performance.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), Multi-Media Card (MMC), embedded MMC (eMMC), Dual In-line Memory Module (DIMM), Registered DIMM (RDIMM), and Load Reduced DIMM (LRDIMM) communication methods.

Figure 2:
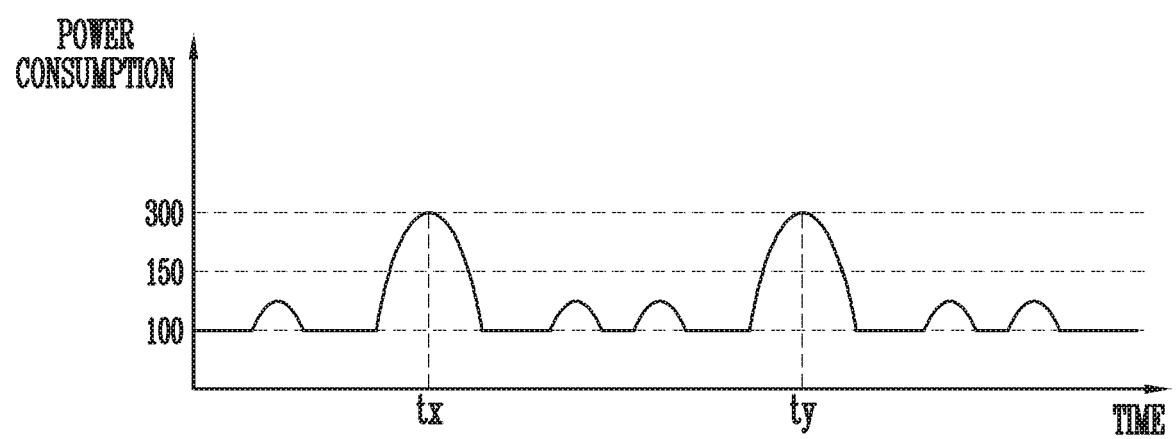
FIG. 2 is a diagram describing power consumption of a storage device.

FIG. 2 is a diagram describing power consumption of a storage device.

Referring to FIG. 2, a horizontal axis of FIG. 2 indicates a time elapsed since the power of a storage device is turned on. A vertical axis of FIG. 2 indicates the amount of power consumed by the storage device (i.e., power consumption). In an embodiment, the power consumption on the vertical axis of FIG. 2 may be the amount of current flowing through a memory device. Therefore, in FIG. 2, the unit of the vertical axis may be "mW" or "mA".

Power consumption, indicating the amount of power consumed by the storage device, may be determined so that the cases of power consumption are divided into a case where the memory controller performs an error correction operation and a case where the memory controller does not perform an error correction operation. When the memory controller does not perform an error correction operation, power consumption of the storage device may be made within a predetermined range.

In an embodiment, when the memory controller does not perform an error correction operation, power consumption of the storage device may fall within a range from 100 to 150. The amount of power consumed by the storage device may be 100 on average, but, when a large number of operations are performed during a specific time, the amount of power consumed by the storage device may exceed 100. However, when the memory controller does not perform an error correction operation, power consumption may not exceed 150. Therefore, the storage device may consume power within the predetermined range, i.e., the range from 100 to 150, thus performing a stable operation.

In FIG. 2, at all times except times tx and ty, the power consumption of the storage device is maintained at a value ranging from 100 to 150, and thus the storage device may be stably operated. When the storage device does not perform an error correction operation, the range in which power consumption is maintained may be a variable range other than the range from 100 to 150. That is, when the storage device does not perform an error correction operation, the maximum value and the minimum value of power consumption may vary.

In an embodiment, when the storage device performs an error correction operation, power consumption of the storage device may exceed 150. That is, unlike other operations performed by the storage device, a large amount of power may be consumed in the error correction operation. During an error correction operation, firmware included in the memory controller executes a defense algorithm, thus consuming a large amount of power. Also, as the storage device performs more error correction operations, a larger amount of power is consumed by the storage device.

Due to the characteristics of each memory cell included in the memory device, as the number of program and erase operations performed on the memory cell is increased, the memory cell may be further degraded. Alternatively, as the number of bits stored in the memory cell is larger, more memory cells may be degraded. That is, a multi-level cell (MLC) for storing two data bits may be more degraded than a single-level cell (SLC) for storing a single data bit. Also, a triple-level cell (TLC) for storing three data bits may be further degraded than the multi-level cell (MLC) for storing two data bits.

When a memory cell is degraded, the occurrence rate of errors in data stored in the memory cell may increase. In order to correct errors in the data stored in the memory cell, the memory controller may execute a defense algorithm.

In an embodiment, firmware included in the memory controller may execute a defense algorithm. Examples of the defense algorithm may include error correction algorithms such as Bose, Chaudhuri, and Hocquenghem Code (BCH code) algorithm and Low-Density Parity Check (LDPC) Code algorithm.

As memory cells included in the memory device are more seriously degraded, the defense algorithm, i.e., an error correction operation, may be more frequently performed. When the memory controller performs more error correction operations, power consumption of the storage device may increase. That is, when the memory controller performs more error correction operations, the future power consumption of the storage device may be increased in proportion to the increased number of error correction operations.

Consequently, the number of program and erase operations performed on memory cells included in the memory device increases, and the memory cells are degraded. As the memory cells are degraded, the memory controller frequently executes the defense algorithm, and thus the number of error corrections performed by the memory controller may increase. As the number of error corrections performed by the memory controller increases, the power consumption of the storage device may increase.

In FIG. 2, time points tx and ty may be time points at which the memory controller performs the error correction operation. Therefore, at time points tx and ty, the power consumption of the storage device may be greater than that occurring when other operations are performed. As a result, when the memory controller performs an error correction operation, the power consumption of the storage device may be high.

In an embodiment, the greater the number of error corrections performed by the memory controller, the higher the power consumption of the storage device. That is, as the number of program and erase operations performed on memory cells included in the memory device is increased, more power may be consumed.

Figure 3:
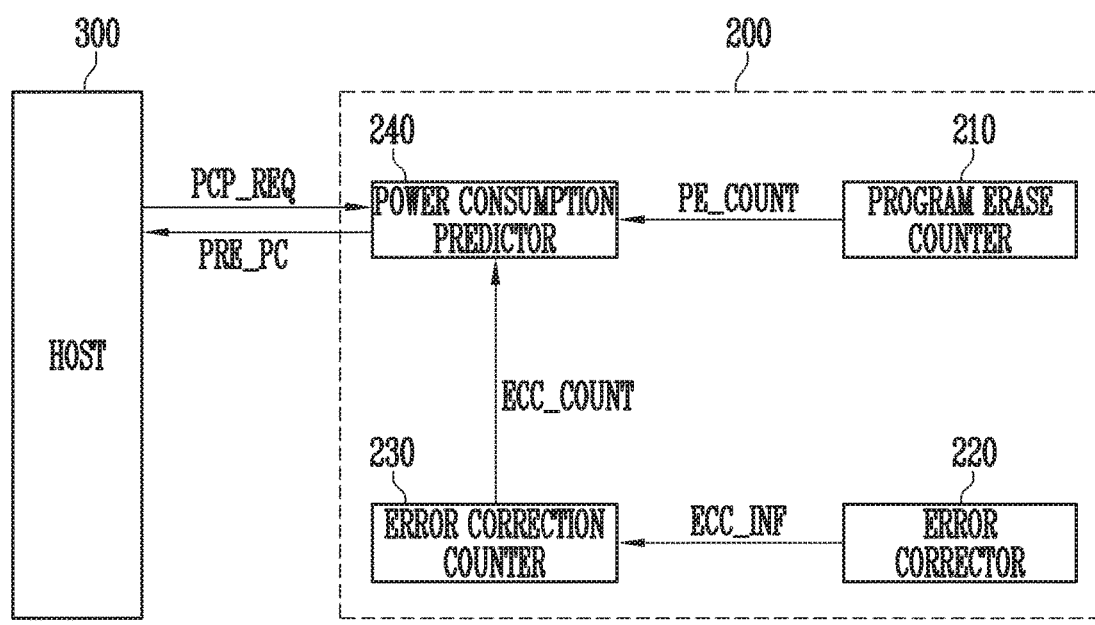
FIG. 3 is a diagram illustrating a configuration of a memory controller of FIG. 1 according to an embodiment of the present invention.

FIG. 3 is a diagram illustrating the configuration of the memory controller of FIG. 1.

Referring to FIG. 3, the memory controller may include a program erase counter 210, an error corrector 220, an error correction counter 230, and a power consumption predictor 240.

The program erase counter 210 may count the number of program and erase operations performed on a memory device. A value counted by the program erase counter 210 may be a program/erase count value PE_COUNT. That is, the program erase counter 210 may generate the program/erase count value PE_COUNT by counting the number of program and erase operations performed on the memory device.

The program erase counter 210 may store a program/erase count value PE_COUNT that is counted whenever a program operation and an erase operation are performed on each of memory cells included in the memory device. That is, the program/erase count value PE_COUNT may be accumulated whenever each memory cell is programmed and erased.

For example, a plurality of memory cells included in the memory device may be respectively programmed or erased. The program erase counter 210 may count a single period from the programming of each memory cell included in the memory device to the erasure of the memory cell by "1". That is, when any one of the plurality of memory cells included in the memory device is programmed and then erased, the program erase counter 210 may increment the program/erase count value PE_COUNT by "1". Thereafter, when the same memory cell is again programmed and then erased, the program erase counter 210 may increment the program/erase count value PE_COUNT to "2" and so on.

As a result, the program erase counter 210 may accumulate and count the number of program and erase operations performed on the memory cell. The program/erase count value PE_COUNT accumulated for each memory cell may be stored in the program erase counter 210. The stored program/erase count value PE_COUNT may be output as the current program/erase count value PE_COUNT to the power consumption predictor 240 when the power consumption predictor 240 receives a power consumption prediction request PCP_REQ from the host or when the power consumption prediction request PCP_REQ is received from the inside of the memory controller 200.

In an embodiment, the program erase counter 210 may count the number of program and erase operations performed on each of a plurality of memory cells included in the memory device. The program erase counter 210 may store the program/erase count value PE_COUNT that is counted for each of the plurality of memory cells included in the memory device. The program/erase count value PE_COUNT may be an average program/erase count value for any one among the plurality of memory cells included in the memory device. Or the program/erase count value PE_COUNT may be an average program/erase count value for the plurality of memory cells included in the memory device. In another embodiment, the program/erase count value PE_COUNT may be an average value of maximum program/erase count value and minimum program/erase count value for the plurality of memory cells included in the memory device.

In an embodiment, the program erase counter 210 may count the number of program and erase operations performed on each of a plurality of memory blocks included in the memory device. The program/erase count value PE_COUNT that is calculated for each of the plurality of memory blocks may be the average of program/erase count values PE_COUNT of a plurality of memory cells included in each of the plurality of memory blocks. The program/erase count value PE_COUNT accumulated for each memory block may be stored in the program erase counter 210.

In an embodiment, the program erase counter 210 may determine an average value, obtained by summing respective program/erase count values of the plurality of memory cells included in the memory device and dividing the sum by the number of memory cells, to be the program/erase count value PE_COUNT. The average value, obtained by summing the numbers of program and erase count values of the plurality of memory cells included in the memory device and dividing the sum by the number of memory cells, may be stored in the program erase counter 210.

The error corrector 220 may correct errors in each operation performed on the memory device. The operation performed on the memory device may be a program (write) operation, a read operation or an erase operation. In particular, when the memory device performs the read operation, data read from the memory device may be error data. That is, the data stored in the memory device and the read data may mismatch. When the data stored in the memory device and the read data mismatch, the error corrector 220 may execute an error correction algorithm for correcting errors. The error correction algorithm may include an error correction code. In an embodiment, examples of the error correction algorithm may include Bose, Chaudhuri, and Hocquenghem Code (BCH code) algorithm and Low-Density Parity Check (LDPC) Code algorithm. The error correction algorithm may include various algorithms in addition to the above examples.

The error corrector 220 may output the error correction information ECC_INF to the error correction counter 230. The error correction information ECC_INF may include information indicating that errors have been corrected. For example, when the operation performed on the memory device fails, the error corrector 220 may complete an error correction operation, and thereafter output error correction information ECC_INF indicting that the corresponding errors have been corrected. The error correction information ECC_INF may include information about each operation performed on the memory device and information indicating the number of times that error is corrected (i.e., the number of error corrections) until the operation performed on the memory device is completed.

In an embodiment, the error corrector 220 may output the error correction information ECC_INF to the error correction counter 230 when the operation performed on the memory device is completed. That is, the number of times that error is corrected in order to complete one operation performed on the memory device may be included in the error correction information ECC_INF.

In particular, when the number of program and erase operations performed on the memory device becomes greater, the number of times that the error corrector 220 corrects errors may be larger. Also, when the read operation is performed on the memory device, the number of times that the error corrector 220 corrects errors may become larger than that occurring when other operations are performed.

The error correction counter 230 may count the number of error corrections for correcting errors in each operation performed on the memory device. The value counted by the error correction counter 230 may be an error correction count value ECC_COUNT.

For example, the error correction counter 230 may receive the error correction information ECC_INF from the error corrector 220, and may then count the number of error corrections. That is, the error correction counter 230 may receive the error correction information ECC_INF and then generate the error correction count value ECC_COUNT. The error correction counter 230 may store the generated error correction count value ECC_COUNT. The stored error correction count value ECC_COUNT may be output as the current error correction count value ECC_COUNT to the power consumption predictor 240 when the power consumption predictor 240 receives a power consumption prediction request PCP_REQ from the host or when the power consumption prediction request PCP_REQ is received from the inside of the memory controller 200.

In an embodiment, since the error correction information ECC_INF includes the number of error corrections occurring until the operation performed on the memory device is completed, it may include the number of times that error is corrected for each operation performed on the memory device. Therefore, the error correction counter 230 may receive the error correction information ECC_INF, and may then accumulate and count the number of error corrections. That is, the number of error corrections, included in the error correction information ECC_INF, may be accumulated, and then the error correction count value ECC_COUNT may be generated. The generated error correction count value ECC_COUNT may be stored in the error correction counter 230.

The power consumption predictor 240 may predict the future power consumption of the storage device depending on the prediction time point. The prediction time point may be a time point elapsed from the reference time point at which the current program/erase count value PE_COUNT is received from the program erase counter 210.

For example, the power consumption predictor 240 may predict the future power consumption of the storage device when the power consumption prediction request PCP_REQ is received from the host or when the power consumption prediction request PCP_REQ is received from the inside of the memory controller 200. The power consumption prediction request PCP_REQ may be a request for outputting predicted power consumption PRE_PC that is a predicted value for the future power consumption of the storage device depending on the prediction time point.

When the power consumption prediction request PCP_REQ is received from the host or when the power consumption prediction request PCP_REQ is received from the inside of the memory controller 200, the power consumption predictor 240 may receive the current program/erase count value PE_COUNT from the program erase counter 210. Also, the power consumption predictor 240 may receive the current error correction count value ECC_COUNT from the error correction counter 230.

The power consumption predictor 240 may predict the future power consumption of the storage device based on the current program/erase count value PE_COUNT and the current error correction count value ECC_COUNT. The power consumption predictor 240 may predict the future power consumption of the storage device based on a reference table. The reference table may include error correction count values ECC_COUNT and anticipated power consumption values which correspond to a plurality of program/erase count values PE_COUNT, respectively. The reference table may be stored in the power consumption predictor 240 at an initialization step of the storage device. The reference table will be described in detail below with reference to FIG. 5.

In an embodiment, the power consumption predictor 240 may predict a future program/erase count value PE_COUNT based on the current program/erase count value PE_COUNT, and may predict the future power consumption of the storage device 50 including the memory device 100 and the memory controller 200, which correspond to the predicted program/erase count value PE_COUNT. Alternatively, the power consumption predictor 240 may set a time point at which the program/erase count value PE_COUNT is received as a reference time point, and may predict the future power consumption of the storage device including the memory device and the memory controller, which correspond to a prediction time point determined based on the reference time point.

The power consumption predictor 240 may set a time point at which the current program/erase count value PE_COUNT is received as the reference time point. The power consumption predictor 240 may predict the future power consumption corresponding to the prediction time point that is a time point elapsed from the reference time point. That is, the power consumption predictor 240 may predict a future program/erase count value PE_COUNT after the reference time point, based on the error correction count values ECC_COUNT and anticipated power consumption values respectively corresponding to the plurality of program/erase count values PE_COUNT included in the reference table.

Thereafter, the power consumption predictor 240 may determine and anticipated power consumption corresponding to the predicted program/erase count value PE_COUNT within the reference table to be the predicted power consumption PRE_PC corresponding to the prediction time point. That is, the power consumption predictor 240 may predict the future power consumption to be subsequently consumed by the storage device based on the current power consumption of the storage device, and may output information about the predicted power consumption to the host.

The power consumption predictor 240 may receive the current program/erase count value PE_COUNT and thereafter set the current program/erase count value PE_COUNT as a reference program/erase count value PE_COUNT corresponding to the reference time point. The program/erase count value PE_COUNT after the reference time point is greater than the reference program/erase count value PE_COUNT. Therefore, the power consumption predictor 240 may output information about the anticipated power consumption corresponding to at least one program/erase count value PE_COUNT greater than the reference program/erase count value PE_COUNT, together with the prediction time point, as the predicted power consumption PRE_PC.

The power consumption predictor 240 may output information about the predicted power consumption PRE_PC in response to the power consumption prediction request PCP_REQ. The predicted power consumption PRE_PC may be the future power consumption of the storage device corresponding to the prediction time point. The predicted power consumption PRE_PC may be the future power consumption corresponding to the predicted program/erase count value PE_COUNT at the prediction time point. The power consumption predictor 240 may also output the predicted error correction count value ECC_COUNT, together with the predicted power consumption PRE_PC.

Figure 4:
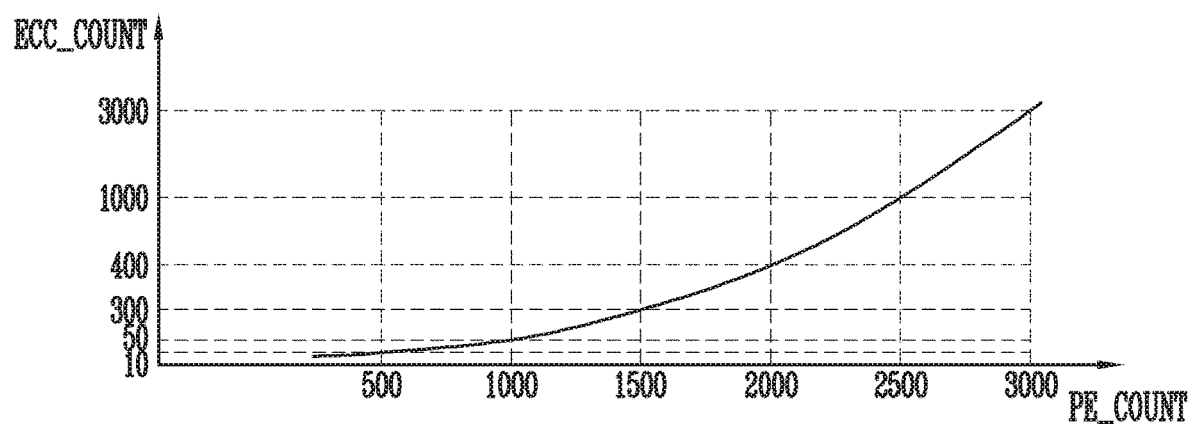
FIG. 4 is a diagram describing error correction count values corresponding to program/erase count values.

FIG. 4 is a diagram describing error correction count values ECC_COUNT corresponding to program/erase count values PE_COUNT.

Referring to FIG. 4, a horizontal axis of FIG. 4 indicates a program/erase count value PE_COUNT. The program/erase count value PE_COUNT may be a value accumulated by counting a period from the programming of each memory cell included in the memory device to the erasure of the memory cell by "1". A vertical axis of FIG. 4 indicates an error correction count value ECC_COUNT. The error correction count value ECC_COUNT may be a value counted by receiving error correction information ECC_INF from the error corrector 220. That is, the error correction count value ECC_COUNT may be a value obtained by accumulating the number of error correction operations performed when the memory device performs each operation. In FIG. 4, the program/erase count values PE_COUNT may correspond to respective error correction count values ECC_COUNT.

In FIG. 4, as the program/erase count value PE_COUNT increases, the error correction count value ECC_COUNT may also increase. Due to the characteristics of each memory cell included in the memory device, as the number of program and erase operations performed on the memory cell is increased, the memory cell may be further degraded. Alternatively, as the number of bits stored in the memory cell is larger, more memory cells may be degraded. The degradation of memory cells may mean that the probability of error occurring in an operation performed on each memory cell may increase. Therefore, as the program/erase count value PE_COUNT increases, the error correction count value ECC_COUNT shows an increasing trend.

FIG. 4 indicates the average of error correction count values ECC_COUNT corresponding to the program/erase count values PE_COUNT. Error correction count values ECC_COUNT corresponding to program/erase count values PE_COUNT for respective memory devices, respective memory blocks or respective memory cells may vary.

In common, as the program/erase count value PE_COUNT increases, the error correction count value ECC_COUNT may also increase. Also, when the program/erase count value PE_COUNT is less than 1500, the error correction count value ECC_COUNT may moderately increase, but, from a time point at which the program/erase count value PE_COUNT reaches 1500, the error correction count value ECC_COUNT may increase more sharply. This shows that, as the program/erase count value PE_COUNT increases, the number of error correction operations attributable to the degradation of memory cells, i.e., the number of times that a defense algorithm is executed by firmware in the memory controller, increases, and thus the error correction count value ECC_COUNT may sharply increase. As the error correction count value ECC_COUNT increases, the power consumption of the storage device may increase.

As a result, as the program/erase count value PE_COUNT increases, the error correction count value ECC_COUNT may also increase. Also, as the error correction count value ECC_COUNT increases, the power consumption of the storage device may increase. That is, since the program/erase count value PE_COUNT and the error correction count value ECC_COUNT have a proportional relationship and the error correction count value ECC_COUNT and the power consumption of the storage device have a proportional relationship, the program/erase count value PE_COUNT and the power consumption of the storage device may have a proportional relationship.

In an embodiment, when the program/erase count value PE_COUNT is 500, the error correction count value ECC_COUNT may be 10. When the program/erase count value PE_COUNT is 1000, the error correction count value ECC_COUNT may be 50. When the program/erase count value PE_COUNT is 1500, the error correction count value ECC_COUNT may be 300. When the program/erase count value PE_COUNT is 2000, the error correction count value ECC_COUNT may be 400. When the program/erase count value PE_COUNT is 2500, the error correction count value ECC_COUNT may be 1000. When the program/erase count value PE_COUNT is 3000, the error correction count value ECC_COUNT may be 3000. The error correction count value ECC_COUNT corresponding to each program/erase count value PE_COUNT may be the average of the error correction count values ECC_COUNT measured depending on the corresponding program/erase count value PE_COUNT.

Since the error correction count value ECC_COUNT may be determined depending on the program/erase count value PE_COUNT, the power consumption predictor 240 included in the memory controller may predict the error correction count value ECC_COUNT corresponding to the program/erase count value PE_COUNT, and may then predict the power consumption of the storage device. That is, after the request has been received from the host, the power consumption predictor 240 may predict error correction count values ECC_COUNT corresponding to program/erase count values PE_COUNT within the reference table and greater than the current program/erase count value PE_COUNT, and may predict the future power consumption values corresponding to the predicted error correction count values ECC_COUNT.

FIG. 5 is a diagram illustrating an example of a reference table.

Referring to FIGS. 4 and 5, FIG. 5 is a diagram illustrating an example in which the graph-type reference table of FIG. 4 is shown as a typical table. The reference table may be stored in the memory controller 200 during an initialization operation of the storage device. The program/erase count values PE_COUNT included in the reference table may include various program/erase count values PE_COUNT in addition to the program/erase count values PE_COUNT included in FIG. 5.

A first column of the reference table indicates a program/erase count value PE_COUNT, a second column thereof indicates an average error correction count value AVECC_COUNT corresponding to the program/erase count value PE_COUNT, and a third column thereof indicates or anticipated power consumption corresponding to the average error correction count value AVECC_COUNT. The first column and the second column of the reference table may be configured based on the values of FIG. 4. That is, the first and second columns of the reference table may be configured using the program/erase count values PE_COUNT and error correction count values ECC_COUNT corresponding to the program/erase count values PE_COUNT, as illustrated in FIG. 4.

Each program/erase count value PE_COUNT may be a value obtained by counting the number of program and erase operations performed on the memory device. The program/erase count value PE_COUNT may be a value accumulated by counting a period from the programming of each memory cell included in the memory device to the erasure of the memory cell by "1". The program/erase count values PE_COUNT of FIG. 5 may be program/erase count values PE_COUNT accumulated after the power of the storage device is turned on. That is, the program/erase count values PE_COUNT may be increased with the lapse of time.

In an embodiment, the reference table may include 500, 1000, 1500, 2000, 2500, and 3000, among the program/erase count values PE_COUNT of FIG. 4. In an embodiment, the program/erase count values PE_COUNT included in the reference table may vary.

Within the reference table, the average error correction count values AVECC_COUNT may be values corresponding to the program/erase count values PE_COUNT. The average error correction count value AVECC_COUNT may be the average of values counted by receiving error correction information ECC_INF from the error corrector 220 included in each of a plurality of memory devices. That is, the average error correction count value AVECC_COUNT may be the average of the values counted by accumulating the numbers of error correction operations performed on the plurality of memory devices when the memory devices perform operations.

Referring to FIGS. 4 and 5, as the program/erase count value PE_COUNT increases, the average error correction count value AVECC_COUNT corresponding to the program/erase count value PE_COUNT may increase. The reason for this is that, due to the characteristics of each memory cell included in the memory device, as the number of program and erase operations performed on the memory cell increases or as the number of bits stored in the memory cell is larger, the memory cell may be further degraded. As the memory cell is degraded, the probability that errors will occur in the operation performed on the memory device increases, and thus the average error correction count value AVECC_COUNT may increase as the program/erase count value PE_COUNT increases.

In an embodiment of the reference table, an average error correction count value AVECC_COUNT corresponding to 500, among the program/erase count values PE_COUNT, may be 10. An average error correction count value AVECC_COUNT corresponding to 1000, among the program/erase count values PE_COUNT, may be 50. An average error correction count value AVECC_COUNT corresponding to 1500, among the program/erase count values PE_COUNT, may be 300. An average error correction count value AVECC_COUNT corresponding to 2000, among the program/erase count values PE_COUNT, may be 400. An average error correction count value AVECC_COUNT corresponding to 2500, among the program/erase count values PE_COUNT, may be 1000. An average error correction count value AVECC_COUNT corresponding to 3000, among the program/erase count values PE_COUNT, may be 3000.

The third column of the reference table may be configured using anticipated power consumption values corresponding to the average error correction count values AVECC_COUNT. The anticipated power consumption means the amount of power consumed when the storage device performs an operation. That is, the anticipated power consumption may include all power consumption that is anticipated in the operations of the memory device and the memory controller.

The amount of power consumed in an error correction operation, among the operations that are performed by the storage device, may be greater than the amount of power consumed in other operations. Therefore, the anticipated power consumption may be determined based on the number of error corrections. As the program/erase count value PE_COUNT increases, the error correction operation by the storage device is frequently performed. As a result, since the error correction operation is frequently performed, the number of error corrections increases, so that the program/erase count value PE_COUNT may increase, and thus anticipated power consumption may also increase.

The anticipated power consumption in the third column may be determined depending on the average error correction count value AVECC_COUNT. That is, as the average error correction count value AVECC_COUNT increases, anticipated power consumption that is, the amount of power predicted to be consumed by the storage device, increases. Thus, as the average error correction count value AVECC_COUNT increases, anticipated power consumption may also increase. Further, when the average error correction count value AVECC_COUNT sharply increases, anticipated power consumption may also sharply increase.

In an embodiment of the reference table, anticipated power consumption corresponding to 10, 50, and 300, among the average error correction count values AVECC_COUNT, may be 300. That is, when the average error correction count value AVECC_COUNT moderately increases, the anticipated power consumption of the storage device may be maintained at a certain value.

In an embodiment of the reference table, anticipated power consumption corresponding to 400, among the average error correction count values AVECC_COUNT, may be 350. In an embodiment of the reference table, anticipated power consumption corresponding to 1000, among the average error correction count values AVECC_COUNT, may be 370. In an embodiment of the reference table, anticipated power consumption corresponding to 3000, among the average error correction count values AVECC_COUNT, may be 400. That is, when the average error correction count value AVECC_COUNT sharply increases, anticipated power consumption may increase.

FIG. 6 is a diagram illustrating an example of a reference table.

Referring to FIGS. 4, 5, and 6, FIG. 6 is a diagram illustrating an example in which the graph-type reference table of FIG. 4 is shown as a typical table based on time TIME, unlike the reference table of FIG. 5. The reference table may be stored in the memory controller 200 during an initialization operation of the storage device. The time TIME included in the reference table may include various times in addition to times TIME indicated in FIG. 6.

A first column of the reference table indicates time TIME, a second column thereof indicates an average error correction count value AVECC_COUNT corresponding to the time TIME, and a third column thereof indicates or anticipated power consumption corresponding to the average error correction count value AVECC_COUNT. The first column and the second column of the reference table may be configured based on the values of FIG. 4. That is, the first and second columns of the reference table may be configured using the times TIME corresponding to program/erase count values PE_COUNT and error correction count values ECC_COUNT corresponding to the program/erase count values PE_COUNT, as illustrated in FIG. 4.

After a power consumption prediction request PCP_REQ is received from the host or when the power consumption prediction request PCP_REQ is received from the inside of the memory controller 200, the power consumption predictor 240 may receive a current program/erase count value PE_COUNT from the program erase counter 210. That is, the power consumption predictor 240 may receive a current program/erase count value PE_COUNT from the program erase counter 210 so as to output predicted power consumption PRE_PC corresponding to the power consumption prediction request PCP_REQ.

When the current program/erase count value PE_COUNT is received from the program erase counter 210, the power consumption predictor 240 may store information about a time point at which the current program/erase count value PE_COUNT is received. The time point at which the current program/erase count value PE_COUNT is received may be a reference time point. Information about the reference time point may be stored in the power consumption predictor 240.

In an embodiment, the power consumption predictor 240 may store information about a time at which the power of the storage device is turned on. Thereafter, the power consumption predictor 240 may store information about a time point at which the current program/erase count value PE_COUNT is received. The time point at which the current program/erase count value PE_COUNT is received may be the reference time point. That is, the reference time point may be a time point at which the power consumption predictor 240 receives the current program/erase count value PE_COUNT after the power of the storage device is turned on. Consequently, the power consumption predictor 240 may calculate the period from the time point at which the power of the storage device is turned on to the time point at which the program/erase count value PE_COUNT is received, may set the calculated time as the reference time point, and may store information about the reference time point.

The reference time point in the reference table is a first reference time point t_ref1. That is, the time at which the power consumption predictor 240 receives the current program/erase count value PE_COUNT may be the first reference time point t_ref1. Therefore, the power consumption predictor 240 may set the first reference time point t_ref1 as the reference time point. That is, the first reference time point t_ref1 may be a time point at which the power consumption predictor 240 receives the current program/erase count value PE_COUNT after the storage device is turned on.

In FIG. 6, the power consumption predictor 240 receives a current program/erase count value PE_COUNT of "1500" at the first reference time point t_ref1. The power consumption predictor 240 may set the first reference time point t_ref1 as the reference time point. That is, the first reference time point t_ref1 may be a time point at which the power consumption predictor 240 receives the current program/erase count value PE_COUNT after the storage device is turned on.

In an embodiment, the reference table may include a reference time point and a prediction time point.

In FIG. 6, the reference time point may be the first reference time point t_ref1, and the prediction time point predicted from the reference time point may be t_ref1−2*ta, t_ref1−ta, t_ref1+ta, t_ref1+2*ta, or t_ref1+3*ta. That is, the program/erase count values PE_COUNT of FIG. 4 may correspond to times TIME, and the average error correction count values AVECC_COUNT corresponding to the times TIME may be included in the reference table.

In an embodiment, the length of the interval between respective prediction time points may be determined based on the program/erase count values PE_COUNT of the reference table and the current program/erase count values PE_COUNT.

For example, in the reference table of FIG. 6, a reference program/erase count value PE_COUNT corresponding to the first reference time point t_ref1 may be 1500, and program/erase count values PE_COUNT less than the reference program/erase count value PE_COUNT within the reference table of FIG. 5 may be 500 and 1000. Therefore, the number of program/erase count values PE_COUNT less than the reference program/erase count value PE_COUNT is 2 within the reference table.

Since the number of program/erase count values PE_COUNT less than the reference program/erase count value PE_COUNT in the reference table is 2 within the reference table, the length of the interval between the program/erase count values PE_COUNT may be a value obtained by dividing a time duration from the turn-on of the storage device to the reference time point, by "3". Therefore, the length of an interval ranging from the time point at which the storage device is turned on to a time point at which the program/erase count value PE_COUNT reaches 500, the length of an interval during which the program/erase count value PE_COUNT changes from 500 to 1000, and the length of an interval during which the program/erase count value PE_COUNT changes from 1000 to 1500 may be determined.

When the length of the interval between the program/erase count values PE_COUNT is determined, the power consumption predictor 240 may determine a prediction time points corresponding to a plurality of program/erase count values PE_COUNT included in the reference table. In an embodiment, the length of the interval between the program/erase count values PE_COUNT may be 'ta'.

Therefore, a time TIME corresponding to a program/erase count value PE_COUNT of 500 may be t_ref1−2*ta, a time TIME corresponding to a program/erase count value PE_COUNT of 1000 may be t_ref1−ta, a time TIME corresponding to a program/erase count value PE_COUNT of 2000 may be t_ref1+ta, a time TIME corresponding to a program/erase count value PE_COUNT of 2500 may be t_ref1+2*ta, and a time TIME corresponding to a program/erase count value PE_COUNT of 3000 may be t_ref1+3*ta. That is, based on the reference time point, the usage pattern of a user may be determined, and thus power consumption corresponding to the subsequent use time of the user, that is, the prediction time point, may be predicted.

The average error correction count value AVECC_COUNT may be a value corresponding to the time TIME. The average error correction count value AVECC_COUNT may be the average of values counted by receiving error correction information ECC_INF from the error corrector 220 included in each of a plurality of memory devices. That is, the average error correction count value AVECC_COUNT may be the average of the values counted by accumulating the numbers of error correction operations performed on the plurality of memory devices when the memory devices perform operations.

Referring to FIGS. 4 and 6, as time TIME increases, the average error correction count value AVECC_COUNT corresponding to time TIME may increase. The reason for this is that, due to the characteristics of memory cells included in the memory device, memory cells may be degraded as time passes. As the memory cells are degraded, the probability that error will occur in each operation performed on the memory device increases, and thus the average error correction count value AVECC_COUNT may increase as time TIME increases.

In an embodiment of the reference table, the average error correction count value AVECC_COUNT corresponding to the time point of t_ref1−2*ta, among the prediction time points, may be 10. An average error correction count value AVECC_COUNT corresponding to the time point of t_ref1−ta, among the prediction time points, may be 50. The average error correction count value AVECC_COUNT corresponding to the first reference time point t_ref1 may be 300. The average error correction count value AVECC_COUNT corresponding to the time point of t_ref1+ta, among the prediction time points, may be 400. The average error correction count value AVECC_COUNT corresponding to the time point of t_ref1+2*ta, among the prediction time points, may be 1000. The average error correction count value AVECC_COUNT corresponding to the time point of t_ref1+3*ta, among the prediction time points, may be 3000.

The third column may be configured using anticipated power consumption values corresponding to the average error correction count values AVECC_COUNT. The anticipated power consumption may mean the amount of power predicted to be consumed when the storage device performs an operation. That is, the anticipated power consumption may be determined to include all power consumption that is in the operations of the memory device and the memory controller.

The amount of power consumed in an error correction operation, among the operations that are performed by the storage device, may be greater than the amount of power consumed in other operations. Therefore, the anticipated power consumption may be determined based on the number of error corrections. As time TIME passes after power is turned on, the error correction operation by the storage device is frequently performed. As the error correction operation is frequently performed, the number of error correction operations increases, so that, as time passes after power has been turned on, anticipated power consumption may increase.

The anticipated power consumption in the third column may be determined depending on the average error correction count value AVECC_COUNT. That is, as the average error correction count value AVECC_COUNT increases, anticipated power consumption that is the amount of power predicted to be consumed by the storage device increases. Thus, as the average error correction count value AVECC_COUNT increases, anticipated power consumption may also increase. Further, when the average error correction count value AVECC_COUNT sharply increases, anticipated power consumption may also sharply increase.

In an embodiment of the reference table, anticipated power consumption corresponding to 10, 50, and 300, among the average error correction count values AVECC_COUNT, may be 300. That is, when the average error correction count value AVECC_COUNT moderately increases, the anticipated power consumption of the storage device may be maintained at a certain value.

In an embodiment of the reference table, anticipated power consumption corresponding to 400, among the average error correction count values AVECC_COUNT, may be 350. In an embodiment of the reference table, anticipated power consumption corresponding to 1000, among the average error correction count values AVECC_COUNT, may be 370. In an embodiment of the reference table, anticipated power consumption corresponding to 3000, among the average error correction count values AVECC_COUNT, may be 400. That is, when the average error correction count value AVECC_COUNT sharply increases, anticipated power consumption may increase.

The power consumption predictor 240 may output the predicted power consumption PRE_PC in response to the power consumption prediction request PCP_REQ from the host or the power consumption prediction request PCP_REQ received from the inside of the memory controller 200. The power consumption predictor 240 may output the predicted power consumption PRE_PC, together with the prediction time point, to the host.

In an embodiment, when the current error correction count value ECC_COUNT counted by the error correction counter 230 matches the average error correction count value AVECC_COUNT corresponding to the reference program/erase count value PE_COUNT included in the reference table or falls within a certain range of the average error correction count value AVECC_COUNT, the power consumption predictor 240 may output information about the prediction time point and anticipated power consumption corresponding to the prediction time point to the host based on the reference table.

The power consumption predictor 240 may output information about predicted power consumption PRE_PC corresponding to at least one prediction time point to the host based on the reference time point. In an embodiment, the power consumption predictor 240 may output at least one of a pair of the prediction time point t_ref1+ta and an anticipated power consumption of 350 corresponding to the prediction time point t_ref1+ta, a pair of the prediction time point t_ref1+2*ta and an anticipated power consumption of 370 corresponding to the prediction time point t_ref1+2*ta, and a pair of the prediction time point t_ref1+3*ta and an anticipated power consumption of 400 corresponding to the prediction time point t_ref1+3*ta to the host.

Figures 7, 8A, 8B:
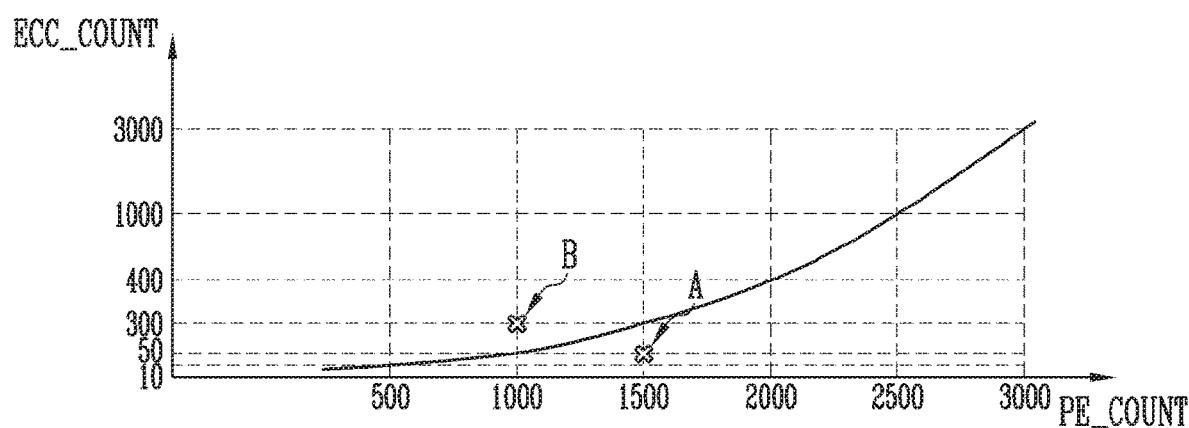
FIG. 7 is a diagram describing an error correction count value determined according to the performance of a storage device.
FIGS. 8A and 8B are diagrams illustrating examples of an adjusted table generated based on a reference table.

FIG. 7 is a diagram describing an error correction count value ECC_COUNT determined according to the performance of a storage device.

Referring to FIGS. 4 and 7, a horizontal axis of FIG. 7 indicates a program/erase count value PE_COUNT. The program/erase count value PE_COUNT may be a value accumulated by counting a period from the programming of each memory cell included in the memory device to the erasure of the memory cell by "1". A vertical axis of FIG. 7 indicates an error correction count value ECC_COUNT. The error correction count value ECC_COUNT may be a value counted by receiving error correction information ECC_INF from the error corrector 220. That is, the error correction count value ECC_COUNT may be a value counted by accumulating the number of error correction operations performed when the memory device performs each operation. In FIG. 7, the program/erase count values PE_COUNT may correspond to respective error correction count values ECC_COUNT.

In FIGS. 4 and 7, error correction count values ECC_COUNT respectively corresponding to a plurality of program/erase count values PE_COUNT may be averages of error correction count values ECC_COUNT. Therefore, depending on the performance of the storage device, the error correction count values ECC_COUNT respectively corresponding to the plurality of program/erase count values PE_COUNT may vary. That is, depending on the performance of the storage device, each error correction count value ECC_COUNT may vary.

With the exception of points A and B in FIG. 7, the graph of FIG. 7 is identical to that of FIG. 4, and thus a description will be made based on the points A and B of FIG. 7.

Each of the points A and B of FIG. 7 indicate when a current error correction count value ECC_COUNT counted by the error correction counter 230 is not identical to the error correction count value ECC_COUNT corresponding to a reference program/erase count value PE_COUNT in the reference table or when the counted error correction count value ECC_COUNT does not fall within a certain range. In this case, the power consumption predictor 240 may generate an adjusted table by adjusting the error correction count value ECC_COUNT and anticipated power consumption which correspond to at least one of a plurality of program/erase count values PE_COUNT included in the reference table.

The point A of FIG. 7 indicates when the current program/erase count value PE_COUNT received from the program erase counter 210 is 1500 and the current error correction count value ECC_COUNT received from the error correction counter 230 is 50. That is, the point A of FIG. 7 indicates when the current error correction count value ECC_COUNT counted by the error correction counter 230 is not identical to the error correction count value ECC_COUNT corresponding to the reference program/erase count value PE_COUNT in the reference table.

In the reference table, even if the error correction count value ECC_COUNT corresponding to a reference program/erase count value PE_COUNT of 1500 is 300, the current error correction count value ECC_COUNT received from the error correction counter 230 may be 50. That is, depending on the performance of the storage device, the current error correction count value ECC_COUNT for the same program/erase count value PE_COUNT may be small with respect to the reference program/erase count value PE_COUNT. The current error correction count value ECC_COUNT being small with respect to the reference program/erase count value PE_COUNT may mean that the same number of program and erase operations (i.e., the reference program/erase count value PE_COUNT) have been performed on the memory device, but a relatively small number of error correction operations have been performed.

When a small number of error correction operations are performed, the power consumption predictor 240 may adjust the reference table and then generate an adjusted table. Alternatively, the power consumption predictor 240 may output adjusted power consumption as predicted power consumption PRE_PC without generating an adjusted table. The adjusted table, generated when a small number of error correction operations are performed, will be described in detail later with reference to FIG. 8.

The point B of FIG. 7 indicates when the current program/erase count value PE_COUNT received from the program erase counter 210 is 1000 and the current error correction count value ECC_COUNT received from the error correction counter 230 is 300. That is, the point B of FIG. 7 indicates when the current error correction count value ECC_COUNT counted by the error correction counter 230 is not identical to the error correction count value ECC_COUNT corresponding to the reference program/erase count value PE_COUNT in the reference table.

In the reference table, even if the error correction count value ECC_COUNT corresponding to a reference program/erase count value PE_COUNT of 1000 is 50, the current error correction count value ECC_COUNT received from the error correction counter 230 may be 300. That is, depending on the performance of the storage device, the current error correction count value ECC_COUNT for the same program/erase count value PE_COUNT may be large with respect to the reference program/erase count value PE_COUNT. The current error correction count value ECC_COUNT being large with respect to the reference program/erase count value PE_COUNT may mean that the same number of program and erase operations (i.e., the reference program/erase count value PE_COUNT) have been performed on the memory device, but a relatively large number of error correction operations have been performed.

When a large number of error correction operations are performed, the power consumption predictor 240 may adjust the reference table and then generate an adjusted table. Alternatively, the power consumption predictor 240 may output adjusted power consumption as predicted power consumption PRE_PC without generating an adjusted table. The adjusted table, generated when a large number of error correction operations are performed, will be described in detail below with reference to FIG. 9.

FIGS. 8A and 8B are diagrams illustrating examples of an adjusted table generated based on a reference table.

Referring to FIGS. 8A and 8B, FIG. 8A illustrates an adjusted table generated by adjusting times TIME including a reference time point and prediction time points, which are set in response to a power consumption prediction request PCP_REQ received from a host or in response to a power consumption prediction request PCP_REQ received from the inside of the memory controller 200, and the error correction count values ECC_COUNT and the anticipated power consumption values, which correspond to the reference time point and the prediction time points. FIG. 8B illustrates an adjusted table generated by adjusting the error correction count values ECC_COUNT and the anticipated power consumption values, which correspond to the current program/erase count values PE_COUNT.

In FIG. 8A, the reference time point may be a first reference time point t_ref1. In an embodiment, the reference time point may be a time point at which the power consumption predictor 240 receives a current program/erase count value PE_COUNT from the program erase counter 210 after the storage device is turned on. When receiving the current program/erase count value PE_COUNT from the program erase counter 210, the power consumption predictor 240 may set a time point at which the current program/erase count value PE_COUNT is received as the reference time point.

In the adjusted table of FIG. 8A, the error correction count value ECC_COUNT corresponding to the reference time point t_ref1 may be adjusted to the current error correction count value ECC_COUNT ("50") counted by the error correction counter 230.

Since the error correction count value ECC_COUNT ("300") corresponding to the reference time point t_ref1 in the reference table of FIG. 6 is not identical to the current error correction count value ECC_COUNT ("50") counted by the error correction counter 230, the error correction count value ECC_COUNT ("300") corresponding to the reference time point may be adjusted to an actually counted error correction count value ECC_COUNT, that is, the current error correction count value ECC_COUNT ("50") counted by the error correction counter 230.

In an embodiment, since the current error correction count value ECC_COUNT received from the error correction counter 230 is 50, the error correction count value ECC_COUNT corresponding to the reference time point t_ref1 may be adjusted to 50.

Additionally, in the adjusted table, the anticipated power consumption corresponding to the reference time point may be adjusted to the anticipated power consumption corresponding to the current error correction count value ECC_COUNT counted by the error correction counter 230 in the reference table of FIG. 6. That is, since power consumption may be determined based on the error correction count value ECC_COUNT, the anticipated power consumption corresponding to the adjusted error correction count value ECC_COUNT may be adjusted with reference to the reference table.

In an embodiment of the adjusted table, since the error correction count value ECC_COUNT corresponding to the reference time point has been adjusted to 50, and the anticipated power consumption corresponding to the pre-measured error correction count value ECC_COUNT of 50 in the reference table is 300, the anticipated power consumption corresponding to the reference time point may be adjusted to 300.

Based on the adjusted error correction count value ECC_COUNT and the adjusted power consumption which correspond to the reference time point, the error correction count value ECC_COUNT and anticipated power consumption which correspond to at least one prediction time point may be adjusted within the adjusted table. The power consumption predictor 240 may adjust the error correction count value ECC_COUNT and anticipated power consumption which correspond to at least one prediction time point.

In an embodiment, the error correction count values ECC_COUNT greater than the adjusted error correction count value ECC_COUNT of 50 in the reference table may be 300, 400, 1000, and 3000. The error correction count values ECC_COUNT greater than the adjusted error correction count value ECC_COUNT may be adjusted to values corresponding to respective prediction time points.

Therefore in the adjusted table, the error correction count value ECC_COUNT corresponding to a prediction time point t_ref1+ta may be adjusted to 300, the error correction count value ECC_COUNT corresponding to a prediction time point t_ref1+2*ta may be adjusted to 400, and the error correction count value ECC_COUNT corresponding to a prediction time point t_ref1+3*ta may be adjusted to 1000.

When the error correction count values ECC_COUNT corresponding to prediction time points are adjusted, the anticipated power consumption values respectively corresponding to the adjusted error correction count values ECC_COUNT may be adjusted within the adjusted table. Since power consumption values are determined depending on error correction count values ECC_COUNT, the anticipated power consumption values respectively corresponding to the adjusted error correction count values ECC_COUNT may be adjusted with reference to the reference table.

In an embodiment of the adjusted table, the anticipated power consumption value corresponding to an adjusted error correction count value ECC_COUNT of 300 may be adjusted to 300, the anticipated power consumption value corresponding to an adjusted error correction count value ECC_COUNT of 400 may be adjusted to 350, and the anticipated power consumption corresponding to an adjusted error correction count value ECC_COUNT of 1000 may be adjusted to 370.

When the anticipated power consumption values respectively corresponding to the adjusted error correction count values ECC_COUNT are adjusted, the generation of the adjusted table may be completed.

When the adjusted table is generated, the power consumption predictor 240 may output information about prediction time points and anticipated power consumption values respectively corresponding to the prediction time points. That is, the power consumption predictor 240 may output information about at least one of prediction time points t_ref1+ta, t_ref1+2*ta, and t_ref1+3*ta and the anticipated power consumption corresponding to the at least one prediction time point in response to the power consumption prediction request PCP_REQ.

In an embodiment, the power consumption predictor 240 may predict future power consumption of the storage device at the prediction time point t_ref1+ta to be 300, future power consumption of the storage device at the prediction time point t_ref1+2*ta to be 350, and future power consumption of the storage device at the prediction time point t_ref1+3*ta to be 370, and may output information about the predicted power consumption PRE_PC to the host. The predicted power consumption PRE_PC may be the anticipated power consumption corresponding to each prediction time point within the adjusted table.

In FIG. 8B, the power consumption predictor 240 may generate an adjusted table by adjusting the error correction count values ECC_COUNT and anticipated power consumption values within the reference table, which correspond to the current program/erase count values PE_COUNT received from the program erase counter 210. The adjusted table may be generated so that a reference time point and prediction time points are included or excluded.

For example, in the adjusted table of FIG. 8B, the error correction count value ECC_COUNT corresponding to a current program/erase count value PE_COUNT received from the program erase counter 210 may be adjusted to a current error correction count value ECC_COUNT counted by the error correction counter 230.

Since the average error correction count value AVECC_COUNT ("300") corresponding to the current program/erase count value PE_COUNT ("1500") received from the program erase counter 210 in the reference table of FIG. 5 is not identical to the current error correction count value ECC_COUNT ("50") counted by the error correction counter 230, the error correction count value ECC_COUNT corresponding to a reference program/erase count value PE_COUNT ("1500") may be adjusted to the actually counted error correction count value ECC_COUNT, that is, the current error correction count value ECC_COUNT ("50") counted by the error correction counter 230.

In an embodiment, since the current error correction count value ECC_COUNT received from the error correction counter 230 is 50, the error correction count value ECC_COUNT corresponding to a reference program/erase count value PE_COUNT of 1500 may be adjusted to 50.

Also, in the adjusted table, the anticipated power consumption corresponding to the current program/erase count value PE_COUNT received from the program erase counter 210 at the reference time point may be adjusted to the anticipated power consumption corresponding to the current error correction count value ECC_COUNT counted by the error correction counter 230 in the reference table of FIG. 5. That is, since power consumption may be determined based on the error correction count value ECC_COUNT, the anticipated power consumption corresponding to the adjusted error correction count value ECC_COUNT may be adjusted with reference to the reference table.

In an embodiment of the adjusted table, since the error correction count value ECC_COUNT corresponding to the current program/erase count value PE_COUNT has been adjusted to 50 and the anticipated power consumption corresponding to the error correction count value ECC_COUNT of 50 in the reference table of FIG. 5 is 300, the anticipated power consumption corresponding to the reference program/erase count value PE_COUNT may be adjusted to 300.

Based on the adjusted error correction count value ECC_COUNT and the adjusted power consumption which correspond to the reference program/erase count value PE_COUNT, the error correction count value ECC_COUNT and anticipated power consumption which correspond to at least one program/erase count value PE_COUNT may be adjusted within the adjusted table. The power consumption predictor 240 may adjust the premeasured error correction count value ECC_COUNT and anticipated power consumption which correspond to at least one program/erase count value PE_COUNT.

In an embodiment, the error correction count values ECC_COUNT greater than the adjusted error correction count value ECC_COUNT of 50 in the reference table may be 300, 400, 1000, and 3000. The error correction count values ECC_COUNT greater than the adjusted error correction count value ECC_COUNT may be adjusted to values respectively corresponding to program/erase count values PE_COUNT greater than the reference program/erase count value PE_COUNT.

Therefore in the adjusted table, the error correction count value ECC_COUNT corresponding to a program/erase count value PE_COUNT of 2000, among program/erase count values PE_COUNT greater than the reference program/erase count value PE_COUNT, may be adjusted to 300, the error correction count value ECC_COUNT corresponding to a program/erase count value PE_COUNT of 2500 may be adjusted to 400, and the error correction count value ECC_COUNT corresponding to a program/erase count value PE_COUNT of 3000 may be adjusted to 1000.

When the error correction count values ECC_COUNT corresponding to program/erase count values PE_COUNT greater than the reference program/erase count value PE_COUNT are adjusted, the anticipated power consumption values respectively corresponding to the adjusted error correction count values ECC_COUNT may be adjusted within the adjusted table. Since power consumption values are determined depending on error correction count values ECC_COUNT, the anticipated power consumption values respectively corresponding to the adjusted error correction count values ECC_COUNT may be adjusted with reference to the reference table.

In an embodiment of the adjusted table, the anticipated power consumption corresponding to an adjusted error correction count value ECC_COUNT of 300 may be 300, the anticipated power consumption corresponding to an adjusted error correction count value ECC_COUNT of 400 may be 350, and the anticipated power consumption corresponding to an adjusted error correction count value ECC_COUNT of 1000 may be 370.

When the anticipated power consumption values respectively corresponding to the adjusted error correction count values ECC_COUNT are adjusted, the generation of the adjusted table may be completed.

Since power consumption values respectively corresponding to the same program/erase count value PE_COUNT in the adjusted table are less than power consumption values respectively corresponding to the program/erase count values PE_COUNT in the reference table, the adjusted table of FIG. 8 may be an adjusted table including error correction count values ECC_COUNT and power consumption values which correspond to program/erase count values PE_COUNT when the performance of the storage device is excellent.

When the adjusted table is generated, the power consumption predictor 240 may output information about power consumption corresponding to at least one of program/erase count values PE_COUNT in the adjusted table.

In an embodiment, the power consumption predictor 240 may predict the future power consumption of the storage device at program/erase count values PE_COUNT of 1500 and 2000 to be 300, the future power consumption of the storage device at a program/erase count value PE_COUNT of 2500 to be 350, and the future power consumption of the storage device at a program/erase count value PE_COUNT of 3000 to be 370, and may output information about the predicted power consumption PRE_PC to the host. The predicted power consumption PRE_PC may be the anticipated power consumption corresponding to each prediction time point within the adjusted table.

FIGS. 9A and 9B are diagrams illustrating examples of an adjusted table generated based on a reference table.

Referring to FIGS. 9A and 9B, FIG. 9A illustrates an adjusted table generated by adjusting times TIME including a reference time point and prediction time points, which are set in response to a power consumption prediction request PCP_REQ received from a host or in response to a power consumption prediction request PCP_REQ received from the inside of the memory controller 200, and the error correction count values ECC_COUNT and the anticipated power consumption values, which correspond to the reference time point and the prediction time points. FIG. 9B illustrates an adjusted table generated by adjusting the error correction count values ECC_COUNT and the anticipated power consumption values, which correspond to the current program/erase count values PE_COUNT.

In FIG. 9A, the reference time point may be a second reference time point t_ref2. In an embodiment, the reference time point may be a time point at which the power consumption predictor 240 receives a current program/erase count value PE_COUNT from the program erase counter 210 after the storage device is turned on. When receiving the current program/erase count value PE_COUNT from the program erase counter 210, the power consumption predictor 240 may set a time point at which the current program/erase count value PE_COUNT is received as the reference time point.

The current program/erase count value PE_COUNT corresponding to the second reference time point t_ref2, that is, a reference program/erase count value PE_COUNT, may be 1000. Program/erase count values PE_COUNT greater than 1000 that is the reference program/erase count value PE_COUNT in the reference table, may be 1500, 2000, 2500, and 3000.

In the adjusted table of FIG. 9A, the error correction count value ECC_COUNT corresponding to the reference time point t_ref2 may be adjusted to the current error correction count value ECC_COUNT ("300") counted by the error correction counter 230.

Since the error correction count value ECC_COUNT ("50") corresponding to the reference time point in the reference table of FIG. 6 is not identical to the current error correction count value ECC_COUNT ("300") counted by the error correction counter 230, the error correction count value ECC_COUNT ("50") corresponding to the reference time point may be adjusted to an actually counted error correction count value ECC_COUNT, that is, the current error correction count value ECC_COUNT ("300") counted by the error correction counter 230.

In an embodiment, since the current error correction count value ECC_COUNT received from the error correction counter 230 is 300, the error correction count value ECC_COUNT corresponding to the reference time point t_ref2 may be adjusted to 300.

Also, in the adjusted table, the anticipated power consumption corresponding to the reference time point may be adjusted to the anticipated power consumption corresponding to the current error correction count value ECC_COUNT counted by the error correction counter 230 in the reference table of FIG. 6. That is, since power consumption may be determined based on the error correction count value ECC_COUNT, power consumption corresponding to the adjusted error correction count value ECC_COUNT may be adjusted with reference to the reference table.

In an embodiment of the adjusted table, since the error correction count value ECC_COUNT corresponding to the reference time point has been adjusted to 300, and the anticipated power consumption corresponding to the error correction count value ECC_COUNT of 300 in the reference table of FIG. 6 is 300, the anticipated power consumption corresponding to the reference time point may be adjusted to 300.

Based on the adjusted error correction count value ECC_COUNT and the adjusted power consumption which correspond to the reference time point, the error correction count value ECC_COUNT and anticipated power consumption which correspond to at least one prediction time point may be adjusted within the adjusted table. The power consumption predictor 240 may adjust the error correction count value ECC_COUNT and anticipated power consumption which correspond to at least one prediction time point.

In an embodiment, the error correction count values ECC_COUNT greater than the adjusted error correction count value ECC_COUNT of 300 in the reference table may be 400, 1000, 3000, and 6000. The error correction count values ECC_COUNT greater than the adjusted error correction count value ECC_COUNT may be adjusted to values corresponding to respective prediction time points.

Therefore in the adjusted table, the error correction count value ECC_COUNT corresponding to a prediction time point t_ref2+tb may be adjusted to 400, the error correction count value ECC_COUNT corresponding to a prediction time point t_ref2+2*tb may be adjusted to 1000, the error correction count value ECC_COUNT corresponding to a prediction time point t_ref2+3*tb may be adjusted to 3000, and the error correction count value ECC_COUNT corresponding to a prediction time point t_ref2+4*tb may be adjusted to 6000.

When the error correction count values ECC_COUNT corresponding to respective prediction time points are adjusted, the anticipated power consumption values respectively corresponding to the adjusted error correction count values ECC_COUNT may be adjusted within the adjusted table. Since power consumption values are determined depending on error correction count values ECC_COUNT, the anticipated power consumption values respectively corresponding to the adjusted error correction count values ECC_COUNT may be adjusted with reference to the reference table.

In an embodiment of the adjusted table, the anticipated power consumption corresponding to an adjusted error correction count value ECC_COUNT of 400 may be adjusted to 350, the anticipated power consumption corresponding to an adjusted error correction count value ECC_COUNT of 1000 may be adjusted to 370, the anticipated power consumption corresponding to an error correction count value ECC_COUNT of 3000 may be adjusted to 400, and the anticipated power consumption value corresponding to an adjusted error correction count value ECC_COUNT of 6000 may be adjusted to 450.

When the anticipated power consumption values respectively corresponding to the adjusted error correction count values ECC_COUNT are adjusted, the generation of the adjusted table may be completed.

When the adjusted table is generated, the power consumption predictor 240 may output information about prediction time points and power consumption values respectively corresponding to the prediction time points. That is, the power consumption predictor 240 may output information about at least one of prediction time points t_ref2+tb, t_ref2+2*tb, t_ref2+3*tb, and t_ref2+4*tb and the anticipated power consumption corresponding to the at least one prediction time point in response to the power consumption prediction request PCP_REQ.

In an embodiment, the power consumption predictor 240 may predict future power consumption of the storage device at the prediction time point t_ref2+tb to be 350, future power consumption of the storage device at the prediction time point t_ref2+2*tb to be 370, future power consumption of the storage device at the prediction time point t_ref2+3*tb to be 400, and future power consumption of the storage device at the prediction time point t_ref2+4*tb to be 450, and may output information about the predicted power consumption PRE_PC to the host. The predicted power consumption PRE_PC may be the anticipated power consumption corresponding to each prediction time point within the adjusted table.

In FIG. 9B, the power consumption predictor 240 may generate an adjusted table by adjusting the error correction count values ECC_COUNT and anticipated power consumption values, which correspond to the current program/erase count values PE_COUNT received from the program erase counter 210. The adjusted table may be generated so that a reference time point and prediction time points are included or excluded.

For example, in the adjusted table of FIG. 9B, the error correction count value ECC_COUNT corresponding to a current program/erase count value PE_COUNT received from the program erase counter 210 may be adjusted to a current error correction count value ECC_COUNT counted by the error correction counter 230.

Since the average error correction count value AVECC_COUNT ("50") corresponding to the program/erase count value PE_COUNT ("1000") received from the program erase counter 210 in the reference table of FIG. is not identical to the current error correction count value ECC_COUNT ("300") counted by the error correction counter 230, the error correction count value ECC_COUNT corresponding to a reference program/erase count value PE_COUNT may be adjusted to the actually counted error correction count value ECC_COUNT, that is, the current error correction count value ECC_COUNT ("300") counted by the error correction counter 230.

In an embodiment of the adjusted table, since the error correction count value ECC_COUNT corresponding to the reference program/erase count value PE_COUNT has been adjusted to 300, and the anticipated power consumption corresponding to the average error correction count value AVECC_COUNT of 300 in the reference table is 300, the anticipated power consumption corresponding to the reference program/erase count value PE_COUNT may be adjusted to 300.

Based on the adjusted error correction count value ECC_COUNT and the adjusted power consumption which correspond to the reference program/erase count value PE_COUNT, the error correction count value ECC_COUNT and anticipated power consumption which correspond to at least one program/erase count value PE_COUNT may be adjusted within the adjusted table. The power consumption predictor 240 may adjust the error correction count value ECC_COUNT and anticipated power consumption, which individually correspond to at least one program/erase count value PE_COUNT.

In an embodiment, the error correction count values ECC_COUNT greater than the adjusted error correction count value ECC_COUNT of 300 in the reference table may be 400, 1000, 3000, and 6000. The error correction count values ECC_COUNT greater than the adjusted error correction count value ECC_COUNT may be adjusted to values respectively corresponding to program/erase count values PE_COUNT greater than the reference program/erase count value PE_COUNT.

Therefore in the adjusted table, the error correction count value ECC_COUNT corresponding to a program/erase count value PE_COUNT of 1500, among program/erase count values PE_COUNT greater than the reference program/erase count value PE_COUNT, may be adjusted to 400, the error correction count value ECC_COUNT corresponding to a program/erase count value PE_COUNT of 2000 may be adjusted to 1000, the error correction count value ECC_COUNT corresponding to a program/erase count value PE_COUNT of 2500 may be adjusted to 3000, and the error correction count value ECC_COUNT corresponding to a program/erase count ECC_COUNT of 3000 may be adjusted to 6000.

When the error correction count values ECC_COUNT corresponding to program/erase count values PE_COUNT greater than the reference program/erase count value PE_COUNT are adjusted, the anticipated power consumption values respectively corresponding to the adjusted error correction count values ECC_COUNT may be adjusted within the adjusted table. Since power consumption values are determined depending on error correction count values ECC_COUNT, the anticipated power consumption values respectively corresponding to the adjusted error correction count values ECC_COUNT may be adjusted with reference to the reference table.

In an embodiment of the adjusted table, the anticipated power consumption corresponding to an adjusted error correction count value ECC_COUNT of 400 may be adjusted to 350, the anticipated power consumption corresponding to an adjusted error correction count value ECC_COUNT of 1000 may be adjusted to 370, the anticipated power consumption corresponding to an adjusted error correction count value ECC_COUNT of 3000 may be adjusted to 400, and the anticipated power consumption value corresponding to an adjusted error correction count value ECC_COUNT of 6000 may be adjusted to 450.

When the anticipated power consumption values respectively corresponding to the adjusted error correction count values ECC_COUNT are adjusted, the generation of the adjusted table may be completed.

Since power consumption values respectively corresponding to the same program/erase count value PE_COUNT in the adjusted table are greater than power consumption values respectively corresponding to the program/erase count values PE_COUNT in the reference table, the adjusted table of FIG. 9 may be an adjusted table including error correction count values ECC_COUNT and power consumption values which correspond to program/erase count values PE_COUNT when the performance of the storage device is bad.

When the adjusted table is generated, the power consumption predictor 240 may output information about a prediction time point, corresponding to at least one of program/erase count values PE_COUNT in the adjusted table, and the anticipated power consumption corresponding to the prediction time point.

That is, the power consumption predictor 240 may output information about a prediction time point corresponding to at least one of program/erase count values PE_COUNT of 1500, 2000, 2500 and 3000 and the anticipated power consumption corresponding to the prediction time point in response to the power consumption prediction request PCP_REQ.

In an embodiment, the power consumption predictor 240 may predict the future power consumption of the storage device to be 350 at the program/erase count value PE_COUNT of 1500, may predict the future power consumption of the storage device to be 370 at the program/erase count value PE_COUNT of 2000, may predict the future power consumption of the storage device to be 400 at the program/erase count value PE_COUNT of 2500, and may predict the future power consumption of the storage device to be 450 at the program/erase count value PE_COUNT of 3000, and may output information about the predicted power consumption PRE_PC to the host. The predicted power consumption PRE_PC may be the antici-pated power consumption corresponding to each prediction time point within the adjusted table.

Figure 10:
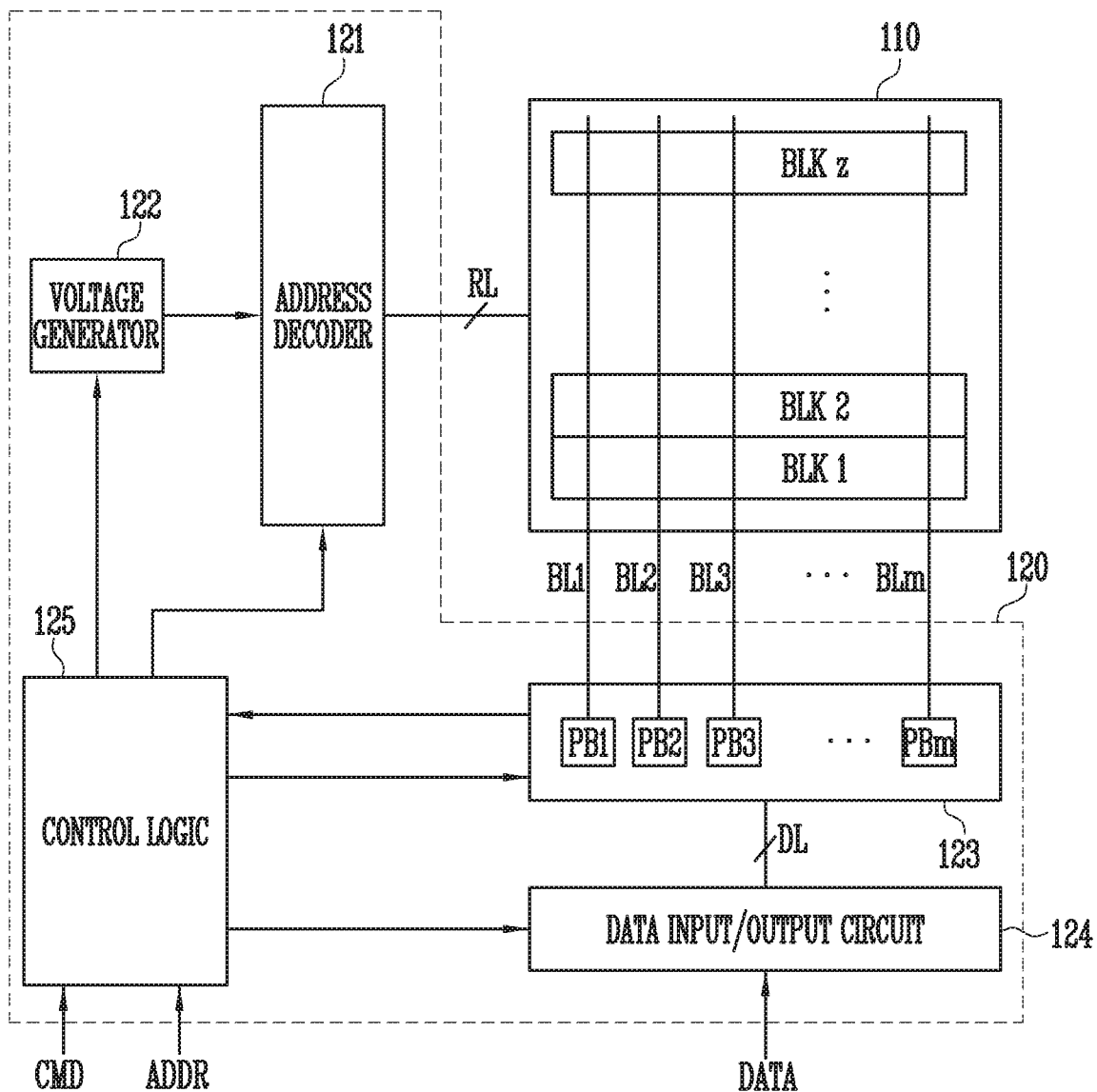
FIG. 10 is a block diagram illustrating a structure of a memory device of FIG. 1 according to an embodiment of the present invention.

FIG. 10 is a block diagram illustrating the structure of the memory device of FIG. 1.

Referring to FIG. 10, a memory device 100 may include a memory cell array 110, a peripheral circuit 120, and a control logic 125.

The memory cell array 110 includes a plurality of memory blocks BLK1 to BLKz. The memory blocks BLK1 to BLKz are coupled to an address decoder 121 through row lines RL and are coupled to a read and write circuit 123 through bit lines BL1 to BLm. Each of the memory blocks BLK1 to BLKz includes a plurality of memory cells. In an embodiment, the plurality of memory cells may be nonvolatile memory cells.

The memory cells included in the memory cell array 110 may be used, with the memory cells being divided into a plurality of blocks according to the usage purpose thereof. System information corresponding to various types of setting information required to control the memory device 100 may be stored in the plurality of blocks.

Each of the first to z-th memory blocks BLK1 to BLKz includes a plurality of cell strings. First to m-th cell strings are respectively coupled to the first to m-th bit lines BL1 to BLm. Each of the first to m-th cell strings includes a drain select transistor, a plurality of series-coupled memory cells, and a source select transistor. The drain select transistor DST is coupled to a drain select line DSL. First to n-th memory cells are respectively coupled to first to n-th word lines WL1 to WLn. The source select transistor SST is coupled to a source select line SSL. A drain of the drain select transistor DST is coupled to the corresponding bit line. The drain select transistors of the first to m-th cell strings are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz. The drain select line DSL, the first to n-th word lines WL1 to WLn, and the source select line SSL are included in the row lines RL. The drain select line DSL, the first to n-th word lines WL1 to WLn, and the source select line SSL are controlled by the address decoder 121. The common source line CSL is controlled by the control logic 125. The first to m-th bit lines BL1 to BLm are controlled by the read and write circuit 123.

The peripheral circuit 120 may include the address decoder 121, a voltage generator 122, the read and write circuit 123, a data input/output circuit 124, and the control logic 125.

The address decoder 121 is coupled to the memory cell array 110 through the row lines RL. The address decoder 121 may be operated under the control of the control logic 125. The address decoder 121 receives addresses ADDR through the control logic 125.

In an embodiment, the program operation and the read operation of the memory device 100 are each performed on a page basis.

During the program and read operations, the addresses ADDR received by the control logic 125 may include a block address and a row address. The address decoder 121 may decode the block address among the received addresses ADDR. The address decoder 121 selects one of the memory blocks BLK1 to BLKz in response to the decoded block address.

The address decoder 121 may decode the row address among the received addresses ADDR. In response to the decoded row address, the address decoder 121 applies voltages, provided from the voltage generator 122, to the row lines RL and then selects one word line of the selected memory block.

During an erase operation, the addresses ADDR include a block address. The address decoder 121 may decode the block address and select one memory block in response to the decoded block address. An erase operation may be performed on all or part of one memory block.

During a partial erase operation, the addresses ADDR may include block and row addresses. The address decoder 121 selects one of the memory blocks BLK1 to BLKz in response to the decoded block address.

The address decoder 121 may decode the row addresses among the received addresses ADDR. In response to the decoded row addresses, the address decoder 121 applies voltages, provided from the voltage generator 122, to the row lines RL and then selects at least one word line of the selected memory block.

In an embodiment, the address decoder 121 may include a block decoder, a word line decoder, an address buffer, etc.

The voltage generator 122 may generate a plurality of voltages using an external supply voltage provided to the memory device 100. The voltage generator 122 is operated under the control of the control logic 125.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage. For example, the voltage generator 122 may include a plurality of pumping capacitors for receiving the internal supply voltage, and may generate a plurality of voltages by selectively enabling the plurality of pumping capacitors under the control of the control logic 125. The generated voltages are applied to word lines selected by the address decoder 121.

During a program operation, the voltage generator 122 may generate a high-voltage program pulse and a pass pulse lower than the program pulse. During a read operation, the voltage generator 122 may generate a read voltage and a pass voltage higher than the read voltage. During an erase operation, the voltage generator 122 may generate an erase voltage.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 125.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data, received through the data input/output circuit 124, to selected memory cells through the bit lines BL1 to BLm when a program pulse is applied to each selected word line. The memory cells in the selected page are programmed based on the transferred data. Memory cells coupled to a bit line to which a program permission voltage (e.g., a ground voltage) is applied may have increased threshold voltages. Threshold voltages of memory cells coupled to a bit line to which a program inhibition voltage (e.g., a supply voltage) is applied may be maintained. During a program verify operation, the first to m-th page buffers may read page data from the selected memory cells through the bit lines BL1 to BLm.

During a read operation, the read and write circuit 123 may read data from the memory cells in the selected page through the bit lines BL, and may output the read data to the data input/output circuit 124. During an erase operation, the read and write circuit 123 may allow the bit lines BL to float.

In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 125. During a program operation, the data input/output circuit 124 receives data DATA to be stored from an external controller (not illustrated).

The control logic 125 is coupled to the address decoder 121, the voltage generator 122, the read and write circuit 123, and the data input/output circuit 124. The control logic 125 may control the overall operation of the memory device 100. The control logic 125 receives a command CMD and addresses ADDR from the external controller. The control logic 125 may control the address decoder 121, the voltage generator 122, the read and write circuit 123, and the data input/output circuit 124 in response to the command CMD.

Figure 11:
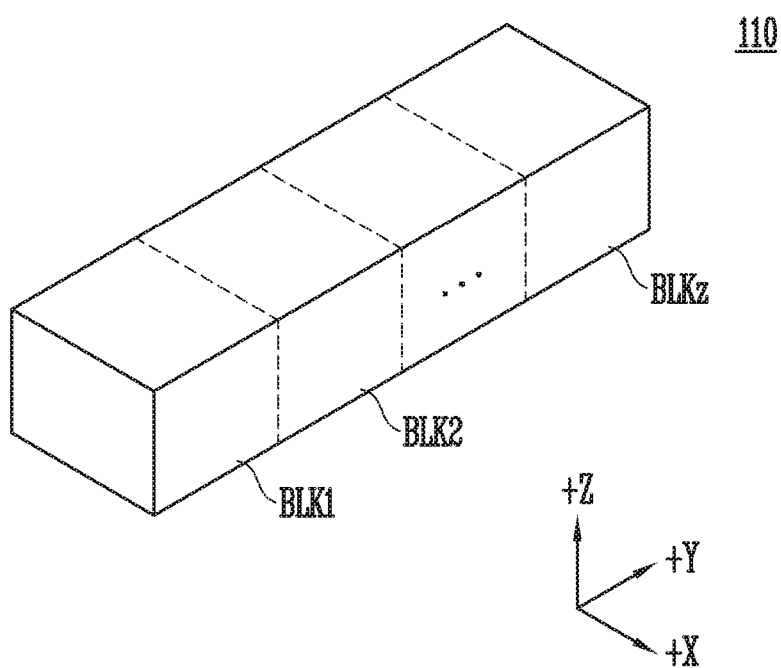
FIG. 11 is a diagram illustrating an embodiment of a memory cell array of FIG. 10.

FIG. 11 is a diagram illustrating an embodiment of the memory cell array of FIG. 10.

Referring to FIG. 11, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described in detail below with reference to FIGS. 12 and 13.

Figure 12:
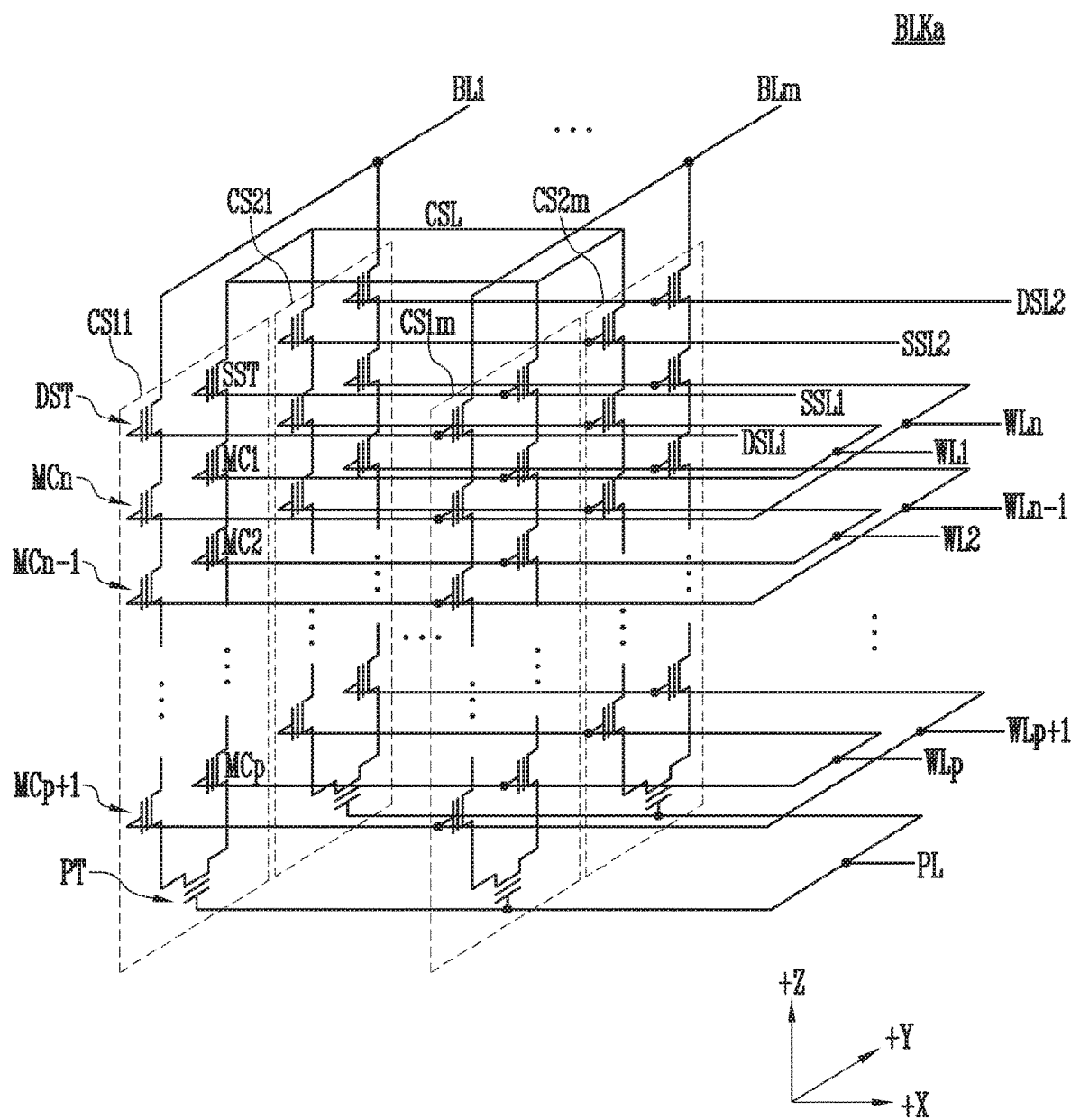
FIG. 12 is a circuit diagram illustrating a memory block BLKa of FIG. 11 according to an embodiment of the present invention.

FIG. 12 is a circuit diagram illustrating any one memory block BLKa of the memory blocks BLK1 to BLKz of FIG. 11.

Referring to FIG. 12, the memory block BLKa includes a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings are arranged in a row direction (i.e., a positive (+) X direction). In FIG. 12, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 12, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is connected between the corresponding bit line and the memory cells MCp+1 to MCn. Drain select transistors of the cell strings in a row direction are coupled to drain select lines extending in a row direction. Drain select transistors of cell strings CS11 to CS1$m$ in the first row are coupled to a first drain select line DSL1. Drain select transistors of cell strings CS21 to CS2$m$ in a second row are coupled to a second drain select line DSL2.

Cell strings arranged in a column direction are coupled to bit lines extending in a column direction. In FIG. 12, cell strings CS11 and CS21 in a first column are coupled to a first bit line BL1. Cell strings CS1$m$ and CS2$m$ in an m-th column are coupled to an m-th bit line BL$m$.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1, among the cell strings CS21 to CS2$m$ in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BL$m$, may be provided. Further, even-numbered cell strings, among the cell strings CS11 to CS1$m$ or CS21 to CS2$m$ arranged in a row direction, may be coupled to the even bit lines, respectively, and odd-numbered cell strings, among the cell strings CS11 to CS1$m$ or CS21 to CS2$m$ arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 13:
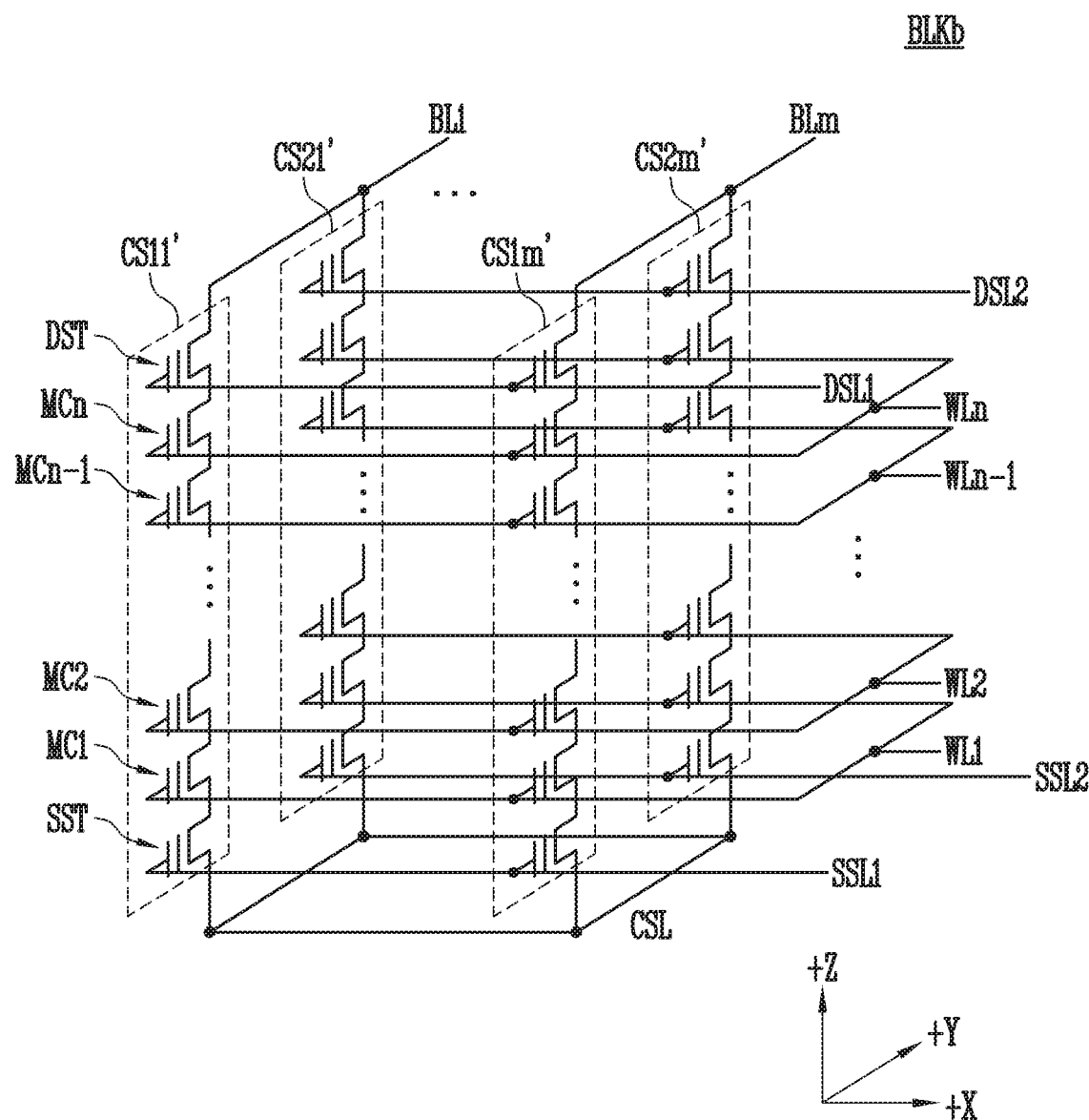
FIG. 13 is a circuit diagram illustrating a memory block BLKb of the memory blocks BLK1 to BLKz of FIG. 11 according to an embodiment of the present invention.

FIG. 13 is a circuit diagram illustrating an example of any one memory block BLKb of the memory blocks BLK1 to BLKz of FIG. 11.

Referring to FIG. 13, the memory block BLKb includes a plurality of cell strings CS11' to CS1$m$' and CS21' to CS2$m$'. Each of the plurality of cell strings CS11' to CS1$m$' and CS21' to CS2$m$' extends in a positive Z (+Z) direction. Each of the cell strings CS11' to CS1$m$' and CS21' to CS2$m$' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1$m$' arranged in a first row are coupled to a first source select line SSL1. Source select transistors of cell strings CS21' to CS2$m$' arranged in a second row are coupled to a second source select line SSL2. In an embodiment, source select transistors of the cell strings CS11' to CS1$m$' and CS21' to CS2$m$' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1$m$' in the first row are coupled to a first drain select line DSL1. The drain select transistors of the cell strings CS21' to CS2$m$' in the second row are coupled to a second drain select line DSL2.

As a result, the memory block BLKb of FIG. 13 has an equivalent circuit similar to that of the memory block BLKa of FIG. 12 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 14:
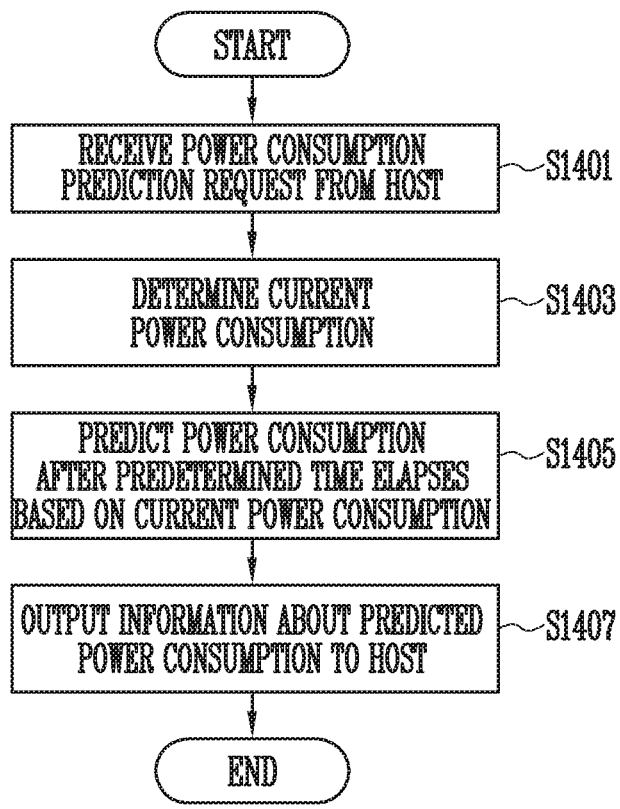
FIG. 14 is a flowchart of an operation of a memory controller according to an embodiment of the present invention.

FIG. 14 is a flowchart of an operation of a memory controller according to an embodiment of the present invention.

Referring to FIG. 14, at step S1401, the power consumption predictor 240 may receive a power consumption prediction request PCP_REQ from a host or from the inside of the memory controller 200. The power consumption prediction request PCP_REQ may be a request to predict the future power consumption of the storage device. In response to the power consumption prediction request PCP_REQ, the power consumption predictor 240 may predict the future power consumption of the storage device.

At step S1403, the power consumption predictor 240 may determine current power consumption of the storage device.

In an embodiment, after the power consumption prediction request PCP_REQ has been received, the power consumption predictor 240 may receive a current program/erase count value PE_COUNT from the program erase counter 210 and a current error correction count value ECC_COUNT from the error correction counter 230. The power consumption predictor 240 may receive the current program/erase count value PE_COUNT and thereafter set the current program/erase count value PE_COUNT as a reference program/erase count value PE_COUNT corresponding to a reference time point.

The power consumption predictor 240 may determine the current power consumption of the storage device based on the current error correction count value ECC_COUNT and a reference table. That is, power consumption corresponding to the current error correction count value ECC_COUNT in the reference table may be determined to be the current power consumption of the storage device.

At step S1405, the power consumption predictor 240 may predict the future power consumption based on the current power consumption.

For example, the power consumption predictor 240 may set, as the reference time point, a time point at which a current program/erase count value PE_COUNT is received from the program erase counter 210 after the storage device 50 is turned on. The power consumption predictor 240 may set a time point elapsed from the reference time point as a prediction time point. That is, the prediction time point may be a time point at which a predetermined time elapses from the reference time point at which the current program/erase count value PE_COUNT is received.

When the prediction time point is determined, the power consumption predictor 240 may predict a program/erase count value PE_COUNT after the reference time point, based on the error correction count values ECC_COUNT and anticipated power consumption values respectively corresponding to a plurality of program/erase count values PE_COUNT included in the reference table. Thereafter, the power consumption predictor 240 may select the anticipated power consumption corresponding to the predicted program/erase count value PE_COUNT within the reference table as the future power consumption corresponding to the prediction time point.

At step S1407, the power consumption predictor 240 may output the predicted power consumption to the host. The predicted power consumption may be a response corresponding to the power consumption prediction request. In an embodiment, the power consumption predictor 240 may predict the future power consumption to be subsequently consumed by the storage device based on the current power consumption of the storage device, and may output information about the predicted power consumption to the host.

For example, the power consumption predictor 240 may output information about the future power consumption corresponding to at least one program/erase count value PE_COUNT greater than the reference program/erase count value PE_COUNT, as predicted power consumption PRE_PC, together with the prediction time point, to the host.

Figure 15:
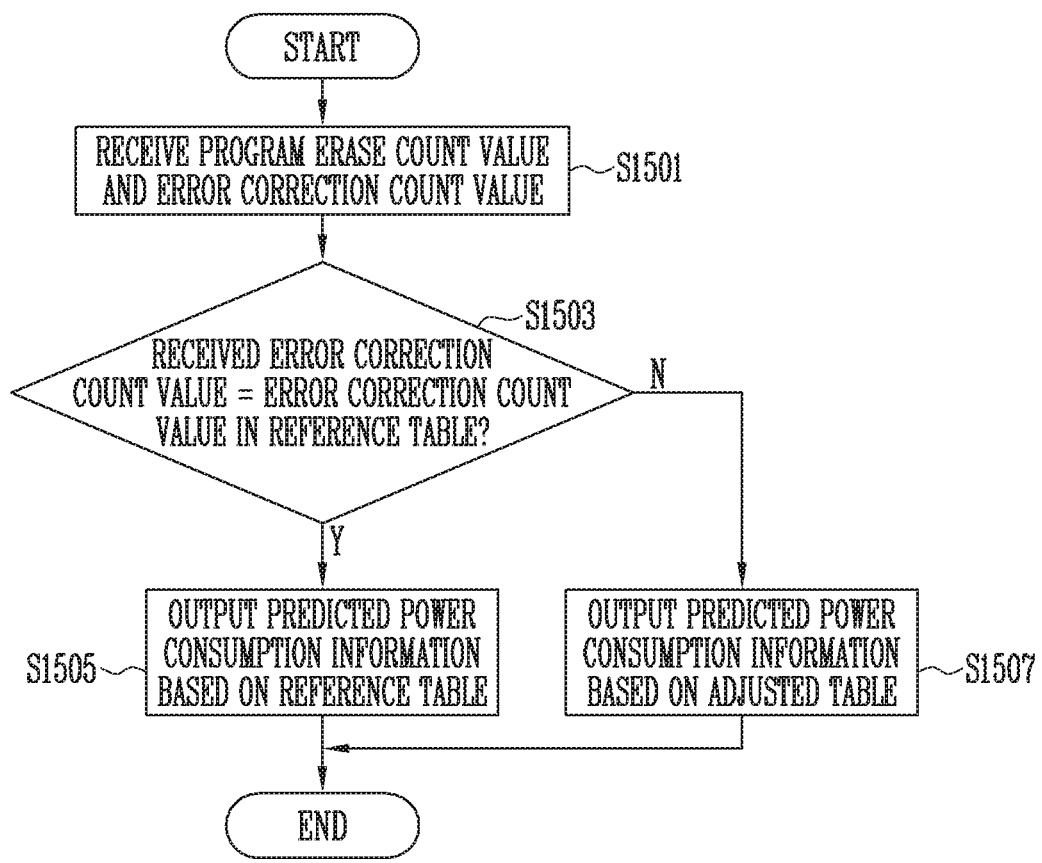
FIG. 15 is a flowchart of an operation of a memory controller according to an embodiment of the present invention.

FIG. 15 is a flowchart of an operation of a memory controller according to an embodiment of the present invention.

Referring to FIG. 15, at step S1501, the power consumption predictor 240 may receive a current program/erase count value PE_COUNT from the program erase counter 210, and may receive a current error correction count value ECC_COUNT from the error correction counter 230. The current program/erase count value PE_COUNT may be a value obtained by counting the number of program and erase operations performed on the memory device. The current error correction count ECC_COUNT may be a value obtained by counting the number of error corrections performed until each operation performed on the memory device is completed. The power consumption predictor 240 may predict the future power consumption of the storage device based on the current program/erase count value PE_COUNT and the current error correction count value ECC_COUNT.

In an embodiment, depending on the pattern in which a user uses the storage device, the program/erase count value PE_COUNT may vary. That is, when the user stores a large amount of data during the same reference time point, the program/erase count value PE_COUNT may be large. Alternatively, when the user stores a small amount of data during the same reference time point, the program/erase count value PE_COUNT may be small. Therefore, the power consumption predictor 240 may determine, based on the current program/erase count value PE_COUNT received after the reference time point has elapsed, the pattern in which the user currently uses the storage device.

At step S1503, whether the current error correction count value is identical to an error correction count value in the reference table may be determined. The current error correction count value may be received from the error correction counter. The error correction count value in the reference table may be an average error correction count value.

For example, the power consumption predictor 240 may determine whether the current error correction count value counted by the error correction counter 230 is identical to the average error correction count value in the reference table. The average error correction count value in the reference table may be an error correction count value corresponding to a reference program/erase count value PE_COUNT in the reference table.

For example, the reference table may be generated based on a plurality of program/erase count values PE_COUNT and error correction count values ECC_COUNT respectively corresponding to a plurality of program/erase count values PE_COUNT. However, depending on the performance of the storage device, the current error correction count value counted by the error correction counter 230 and each error correction count value in the reference table may be different from each other with respect to the current program/erase count value PE_COUNT. Therefore, the power consumption predictor 240 may determine whether to utilize the reference table depending on whether the current error correction count value counted by the error correction counter 230 is identical to the error correction count value in the reference table with respect to the current program/erase count value PE_COUNT.

When the current error correction count value is identical to the error correction count value in the reference table with respect to the current program/erase count value PE_COUNT, the process proceeds to step S1505. When the current error correction count value is not identical to the error correction count value in the reference table with respect to the current program/erase count value PE_COUNT, the process proceeds to step S1507.

At step S1505, the power consumption predictor 240 may output information about the predicted power consumption based on the reference table with respect to the current program/erase count value PE_COUNT. Since the current error correction count value counted by the error correction counter 230 is identical to the error correction count value in the reference table with respect to the current program/erase count value PE_COUNT, the power consumption predictor 240 does not need to generate an adjusted table. Therefore, the power consumption predictor 240 may determine the prediction time point based on the reference table, and may output information about the anticipated power consumption corresponding to the prediction time point as predicted power consumption. Alternatively, the power consumption predictor 240 may output information about the anticipated power consumption, corresponding to the current program/erase count value PE_COUNT, as predicted power consumption based on the reference table.

At step S1507, the power consumption predictor 240 may output information about predicted power consumption based on an adjusted table. Since the current error correction count value counted by the error correction counter 230 is not identical to the error correction count value in the reference table with respect to the current program/erase count value PE_COUNT, the power consumption predictor 240 may generate the adjusted table. The power consumption predictor 240 may adjust the error correction count value and anticipated power consumption which correspond to the reference program/erase count value PE_COUNT, and may generate the adjusted table based on the adjusted error correction count value and the adjusted power consumption within the adjusted table. When the adjusted table is generated, the power consumption predictor 240 may output at least one of program/erase count values PE_COUNT and information about the anticipated power consumption corresponding to the at least one program/erase count value PE_COUNT from the adjusted table, or may output information about a prediction time point and the anticipated power consumption corresponding to the prediction time point from the adjusted table.

Figure 16:
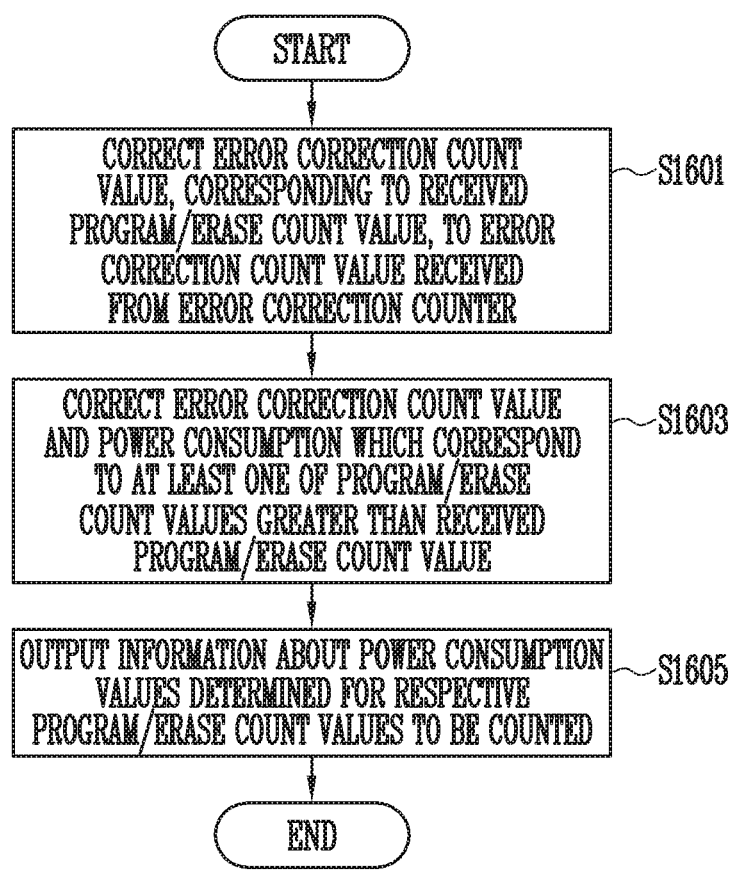
FIG. 16 is a flowchart of an operation of a memory controller according to an embodiment of the present invention.

FIG. 16 is a flowchart of an operation of a memory controller according to an embodiment of the present invention.

Referring to FIGS. 15 and 16, FIG. 16 illustrates in detail the sequence of a method of generating an adjusted table. That is, FIG. 16 is a diagram illustrating in detail step S1507 of FIG. 15.

At step S1601, the power consumption predictor 240 may adjust the error correction count value ECC_COUNT corresponding to the current program/erase count value PE_COUNT received from the program erase counter 210, to the current error correction count value ECC_COUNT received from the error correction counter 230 within the reference table.

For example, since the error correction count value ECC_COUNT corresponding to the current program/erase count value PE_COUNT received from the program erase counter 210 in the reference table is not identical to the current error correction count value ECC_COUNT counted by the error correction counter 230, the error correction count value ECC_COUNT within the reference table corresponding to the current program/erase count value PE_COUNT received from the program erase counter 210 may be adjusted to the actually counted error correction count value ECC_COUNT, that is, the current error correction count value ECC_COUNT counted by the error correction counter 230.

When the error correction count value ECC_COUNT corresponding to the current program/erase count value PE_COUNT received from the program erase counter 210 is adjusted, the anticipated power consumption corresponding to the program/erase count value PE_COUNT received from the program erase counter 210 within the reference table may be adjusted to the anticipated power consumption corresponding to the adjusted error correction count value ECC_COUNT.

At step S1603, the error correction count value ECC_COUNT and anticipated power consumption, which correspond to at least one of program/erase count values PE_COUNT greater than the current program/erase count value PE_COUNT received from the program erase counter 210 within the reference table, may be adjusted. The error correction count values ECC_COUNT and the anticipated power consumption values which respectively correspond to program/erase count values PE_COUNT within the reference table may be adjusted based on the adjusted error correction count value ECC_COUNT and the adjusted power consumption, which correspond to the current program/erase count value PE_COUNT received from the program erase counter 210. As a result, the error correction count value ECC_COUNT and anticipated power consumption, which correspond to a prediction time point at which at least one of the program/erase count values PE_COUNT may be predicted, may be adjusted.

For example, the error correction count values ECC_COUNT greater than the adjusted error correction count value ECC_COUNT in the reference table may correspond to the program/erase count values PE_COUNT greater than the reference program/erase count value PE_COUNT based on the reference table. Thereafter, with reference to the reference table, the anticipated power consumption values respectively corresponding to the adjusted error correction count values ECC_COUNT may be adjusted. When the anticipated power consumption values respectively corresponding to the adjusted error correction count values ECC_COUNT are adjusted, the generation of the adjusted table may be completed.

At step S1605, the adjusted power consumption values determined for respective program/erase count values PE_COUNT may be output. For example, the power consumption predictor 240 may output at least one of program/erase count values PE_COUNT greater than the reference program/erase count value PE_COUNT in the adjusted table, that is, predicted program/erase count values PE_COUNT, and information about the future power consumption corresponding to the at least one program/erase count value PE_COUNT from the adjusted table, or may output information about a prediction time point and the future power consumption corresponding to the prediction time point from the adjusted table. The prediction time point may be determined depending on the predicted program/erase count value PE_COUNT.

Figure 17:
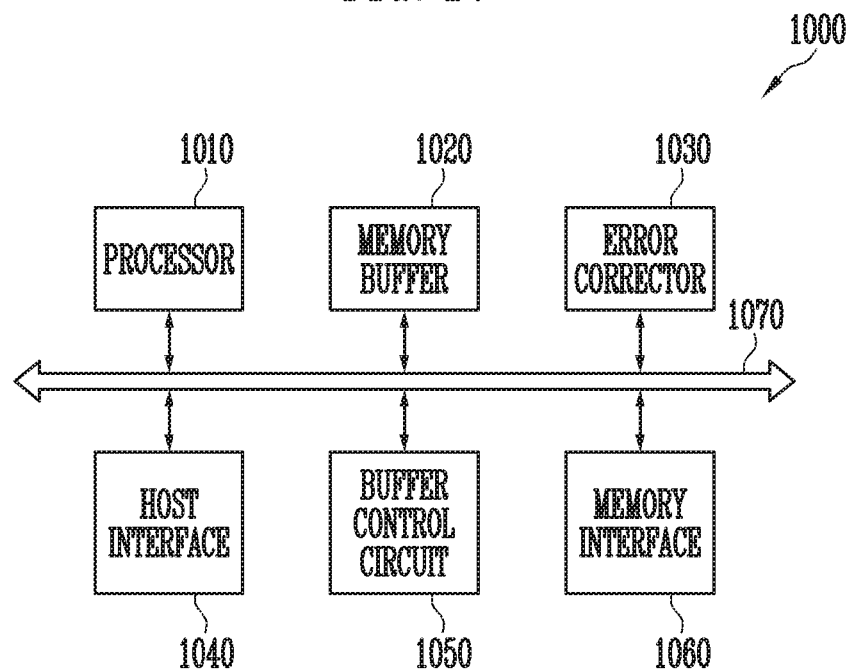
FIG. 17 is a diagram illustrating an embodiment of the memory controller of FIG. 1 according to an embodiment of the present invention.

FIG. 17 a diagram illustrating an embodiment of the memory controller of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 17, the memory controller 1000 may include a processor 1010, a memory buffer 1020, an error corrector (error correction code: ECC) 1030, a host interface 1040, a buffer control circuit 1050, a memory interface 1060, and a bus 1070.

The error corrector (ECC) 1030 of FIG. 17 may perform operations performed by the error corrector 220 of FIG. 3.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The error corrector 1030 may perform error correction. The error corrector 1030 may perform error correction code (ECC) encoding based on data to be written to the memory device through the memory interface 1060. The ECC-encoded data may be transferred to the memory device through the memory interface 1060. The error corrector 1030 may perform ECC decoding based on data received from the memory device through the memory interface 1060. In an example, the error corrector 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), Multi-Media Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the error corrector 1030, and the memory interface 1060. The control bus may be coupled to the host interface 1040, the processor 1010, the buffer control circuit 1050, the memory buffer 1020, and the memory interface 1060.

Figure 18:
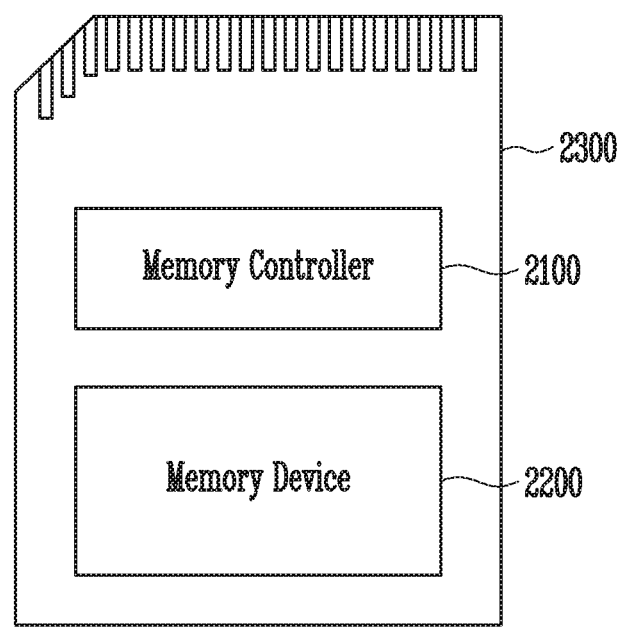
FIG. 18 is a block diagram illustrating a memory card system to which a storage device according to an embodiment of the present invention is applied.

FIG. 18 is a block diagram illustrating a memory card system to which the storage device according to an embodiment of the present invention is applied.

Referring to FIG. 18, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory device 2200 may be implemented in the same way as the memory device 100 described above with reference to FIG. 10.

In an embodiment, the memory controller 2100 may include components, such as a RAM, a processor, a host interface, a memory interface, and an error corrector.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 19:
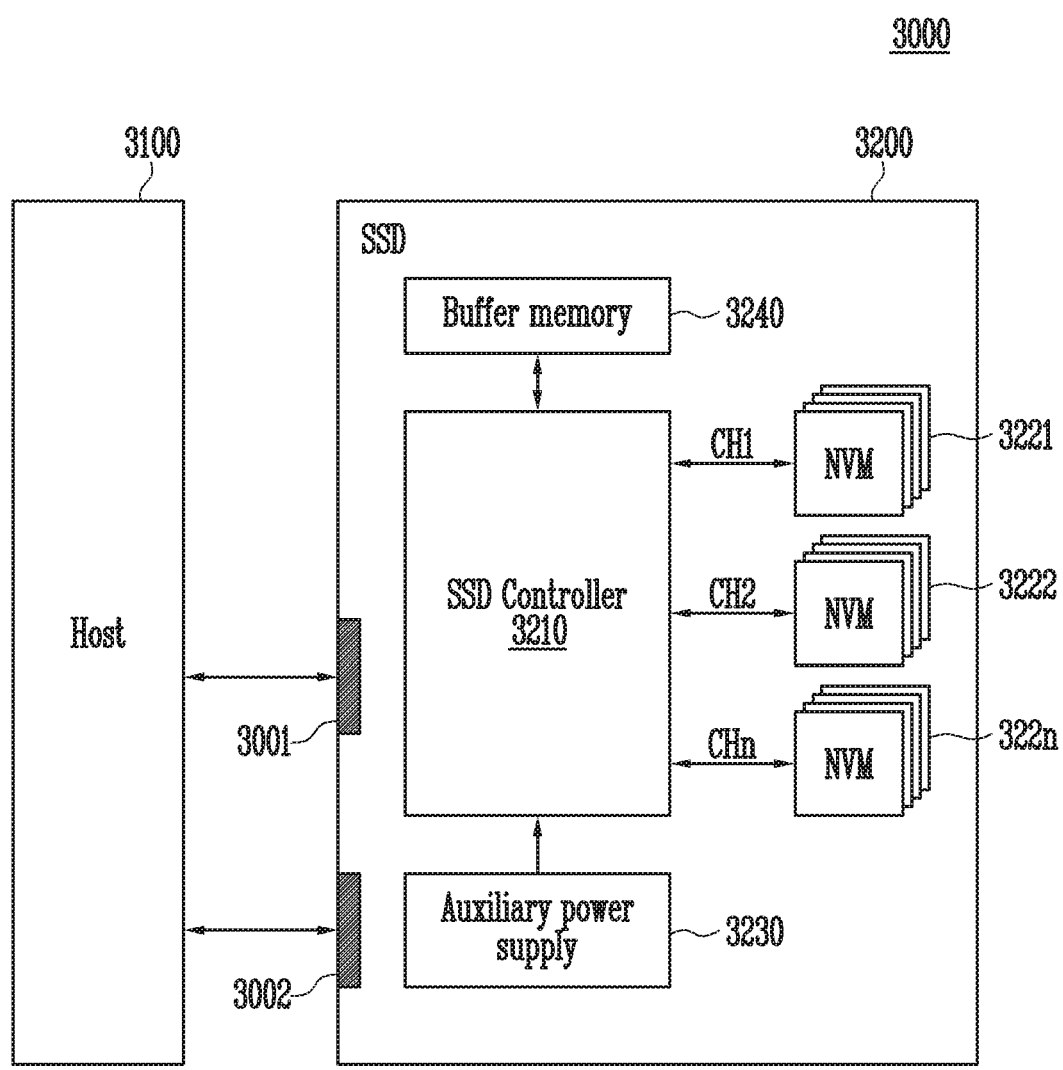
FIG. 19 is a block diagram illustrating an example of a solid-state drive (SSD) system to which a storage device according to an embodiment of the present invention is applied.

FIG. 19 is a block diagram illustrating an example of a solid-state drive (SSD) system to which the storage device according to an embodiment of the present invention is applied.

Referring to FIG. 19, an SSD system 3000 may include a host 3100 and an SSD 3200. The SSD 3200 may exchange signals SIG with the host 3100 through a signal connector 3001 and may receive power PR through a power connector 3002. The SSD 3200 may include an SSD controller 3210, a plurality of flash memories 3221 to 322$n$, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322$n$ in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322$n$ or may temporarily store metadata (e.g., mapping tables) of the flash memories 3221 to 322$n$. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 20:
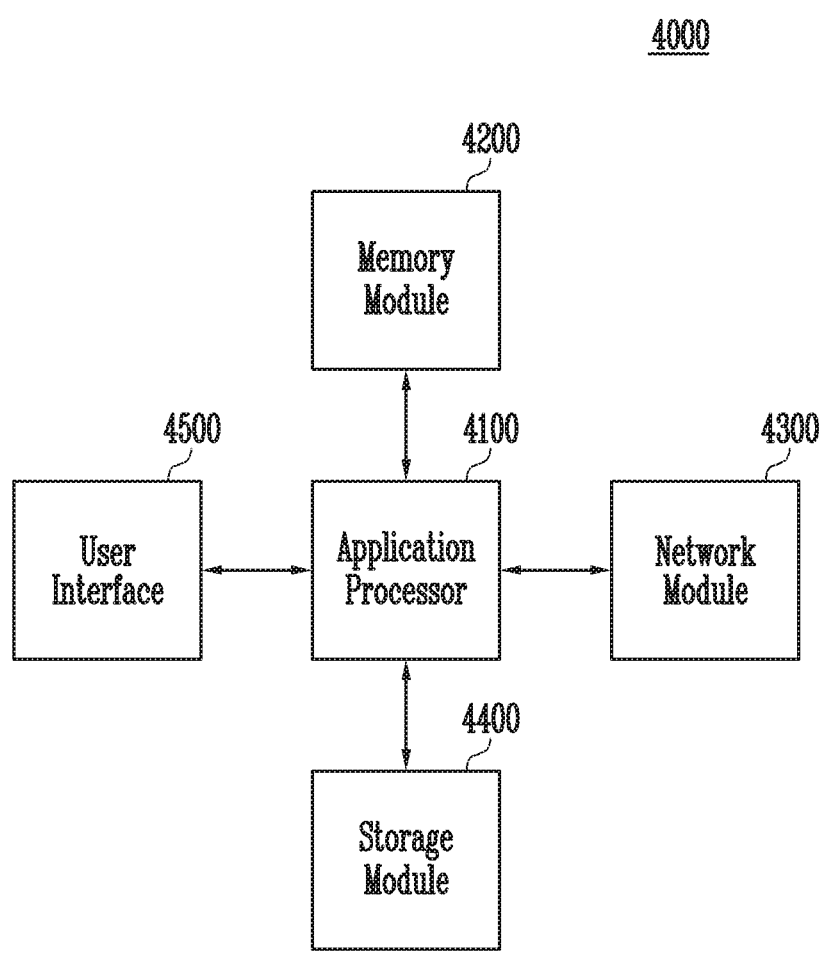
FIG. 20 is a block diagram illustrating a user system to which a storage device according to an embodiment of the present invention is applied.

FIG. 20 is a block diagram illustrating a user system to which the storage device according to an embodiment of the present invention is applied.

Referring to FIG. 20, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIGS. 10 to 13. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there are provided a memory controller that predicts power consumption of a storage device and outputs information about the predicted power consumption to a host and a method of operating the memory controller.

While various embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

In the above-discussed embodiments, all steps may be selectively performed or skipped. In addition, the steps in each embodiment may not always be sequentially performed in given order, and may be randomly performed. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A memory controller for controlling a memory device, the memory controller comprising:
    a program erase counter configured to count a number of program and erase operations performed on the memory device and then generate a current program/erase count value;
    an error correction counter configured to count a number of error corrections for correcting error in an operation performed on the memory device and then generate a current error correction count value; and a power consumption predictor configured to:
    predict a future program/erase count value based on the current program/erase count value;
    predict future power consumption of a storage device including the memory device and the memory controller, the future power consumption corresponding to the predicted program/erase count value; and
    output information about the predicted future power consumption to a host.

2. The memory controller according to claim 1, further comprising an error corrector configured to perform error corrections and output error correction information indicating that the error has been corrected.

3. The memory controller according to claim 2, wherein the error correction counter counts the number of error corrections based on the error correction information.

4. The memory controller according to claim 1, further comprising a reference table including an average error correction count value and anticipated power consumption, which correspond to a program/erase count value.

5. The memory controller according to claim 4, wherein the power consumption predictor is configured to predict the future power consumption based on the reference table when the current error correction count value is identical to the average error correction count value corresponding to the current program/erase count value within the reference table.

6. The memory controller according to claim 4, wherein the power consumption predictor is configured to generate an adjusted table by adjusting the average error correction count value and the anticipated power consumption, which correspond to at least one of the program/erase count values within the reference table when the current error correction count value is not identical to the average error correction count value corresponding to the current program/erase count value within the reference table.

7. The memory controller according to claim 6, wherein the adjusted table is configured such that:
the average error correction count value corresponding to the current program/erase count value is adjusted to the current error correction count value, and
the anticipated power consumption corresponding to the current program/erase count value is adjusted to the anticipated power consumption corresponding to the current error correction count value within the reference table.

8. The memory controller according to claim 7, wherein the power consumption predictor is configured to adjust, based on the adjusted error correction count value and the adjusted power consumption which correspond to the current program/erase count value, the average error correction count value and the anticipated power consumption which correspond to the predicted program/erase count value.

9. A memory controller for controlling a memory device that stores data, the memory controller comprising:
a program erase counter configured to count a number of program and erase operations performed on the memory device and then generate a current program/erase count value;
an error correction counter configured to count a number of error corrections for correcting errors in an operation performed on the memory device and then generate a current error correction count value; and
a power consumption predictor configured to:
set a time point at which the current program/erase count value is received as a reference time point;
predict future power consumption of a storage device including includes the memory device and the memory controller, the future power consumption corresponding to a prediction time point determined based on the reference time point; and
output information about the predicted future power consumption to a host.

10. The memory controller according to claim 9, further comprising a reference table including an average error correction count value and anticipated power consumption, which correspond to a prediction time point.

11. The memory controller according to claim 10, wherein the power consumption predictor is configured to determine the prediction time point corresponding to at least one of the average error correction count values included in the reference table based on the reference time point.

12. The memory controller according to claim 10, wherein the power consumption predictor is configured to:
predict the future power consumption corresponding to the prediction time point based on the reference table when the current error correction count value is identical to the average error correction count value corresponding to the reference time point within the reference table, and
generate an adjusted table by adjusting the average error correction count value and the anticipated power consumption, which correspond to at least one of the prediction time points within the reference table when the current error correction count value is not identical to the average error correction count value corresponding to the reference time point within the reference table.

13. The memory controller according to claim 12, wherein the adjusted table is configured such that:
the average error correction count value corresponding to the reference time point is adjusted to the current error correction count value,
the anticipated power consumption corresponding to the reference time point is adjusted to the anticipated power consumption corresponding to the current error correction count value within the reference table, and
the average error correction count value and the anticipated power consumption which correspond to the prediction time point are adjusted based on the adjusted error correction count value and the adjusted power consumption which correspond to the reference time point.

14. A method of operating a memory controller for controlling a memory device, the method comprising:
counting a number of program and erase operations performed on the memory device, and then generating a current program/erase count value;
counting a number of error corrections for correcting error in an operation performed on the memory device, and then generating a current error correction count value;
predicting future power consumption of a storage device including the memory device and the memory controller based on the current program/erase count value and the current error correction count value; and
outputting information about the predicted future power consumption to a host.

15. The method according to claim 14, wherein the current error correction count value is counted when the memory device receives error correction information indicating that error in the operation performed on the memory device has been corrected through the error corrections.

16. The method according to claim 14, wherein the predicting the future power consumption includes predicting the future power consumption corresponding to at least one of a plurality of program/erase count values within a reference table including an average error correction count value and anticipated power consumption, which correspond to each of the at least one of the program/erase count values.

17. The method according to claim 16, further comprising:
setting a time point at which the current program/erase count value is received as a reference time point; and
setting the current program/erase count value as a reference program/erase count value corresponding to the reference time point.

18. The method according to claim 17, further comprising determining a prediction time point corresponding to the at least one of program/erase count values included in the reference table based on the reference time point.

19. The method according to claim 18, wherein the predicting the future power consumption includes predicting the future power consumption corresponding to the prediction time point based on the reference table when the current error correction count value is identical to the average error correction count value corresponding to the current program/erase count value within the reference table.

20. The method according to claim 18, wherein the predicting the future power consumption further comprises generating an adjusted table by adjusting the average error correction count value and the anticipated power consumption, which correspond to the at least one of program/erase count values within the reference table when the current error correction count value is not identical to the average error correction count value corresponding to the current program/erase count value within the reference table.

* * * * *